(12) United States Patent
Tamo et al.

(10) Patent No.: US 8,694,866 B2
(45) Date of Patent: Apr. 8, 2014

(54) MDS ARRAY CODES WITH OPTIMAL BUILDING

(75) Inventors: Itzhak Tamo, Pasadena, CA (US); Zhiying Wang, Pasadena, CA (US); Jehoshua Bruck, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 69 days.

(21) Appl. No.: 13/421,723

(22) Filed: Mar. 15, 2012

(65) Prior Publication Data

US 2012/0278689 A1 Nov. 1, 2012

Related U.S. Application Data

(60) Provisional application No. 61/452,863, filed on Mar. 15, 2011, provisional application No. 61/490,503, filed on May 26, 2011.

(51) Int. Cl.
*G11C 29/00* (2006.01)

(52) U.S. Cl.
USPC .......................................... 714/770; 714/805

(58) Field of Classification Search
USPC ......... 714/752, 786, 799, 785, 784, 770, 805, 714/769
See application file for complete search history.

(56) References Cited

U.S. PATENT DOCUMENTS

| | | | | |
|---|---|---|---|---|
| 5,596,709 A | * | 1/1997 | Bond et al. | 714/6.32 |
| 5,960,169 A | * | 9/1999 | Styczinski | 714/6.12 |
| 6,079,029 A | * | 6/2000 | Iwatani et al. | 714/6.12 |
| 6,195,727 B1 | * | 2/2001 | Islam et al. | 711/114 |
| 6,230,240 B1 | * | 5/2001 | Shrader et al. | 711/114 |
| 6,330,687 B1 | * | 12/2001 | Griffith | 714/6.21 |
| 6,401,170 B1 | * | 6/2002 | Griffith et al. | 711/114 |
| 2006/0129873 A1 | * | 6/2006 | Hafner | 714/5 |

* cited by examiner

*Primary Examiner* — Albert Decady
*Assistant Examiner* — Osman Alshack
(74) *Attorney, Agent, or Firm* — Kilpatrick Townsend & Stockton LLP

(57) ABSTRACT

MDS (maximum distance separable) array codes are widely used in storage systems to protect data against erasures. The rebuilding ratio problem is addressed and efficient parity codes are proposed. A controller as disclosed is configured for receiving configuration data at the controller that indicates operating features of the array and determining a parity code for operation of the array according to a permutation, wherein the configuration data specifies the array as comprising nodes defined by $A=(a_{i,j})$ with size $r^m \times k$ for some integers k,m, and wherein for $T=\{v_0, \ldots, V_{k-1}\} \subset Z_r^m$ a subset of vectors of size k, where for each $v=(v_1, \ldots, v_m) \in T$, $\gcd(v_1, \ldots, v_m, r)$, where gcd is the greatest common divisor, such that for any l, $0 \le l \le r-1$, and $v \in T$, the code values are determined by the permutation $f_v^l: [0, r^m-1] \to [0, r^m-1]$ by $f_v^l(x) = x + lv$.

10 Claims, 10 Drawing Sheets

|   | 0 | 1 | 2 | R | Z |
|---|---|---|---|---|---|
| 0 | ♣ | ♠ | ♥ |   | ♣ |
| 1 | ♥ | ♦ | ♣ |   | ♥ |
| 2 | ♠ | ♣ | ♦ |   | ♠ |
| 3 | ♦ | ♥ | ♠ |   | ♦ |

|   | 0 | 1 | 2 | R | Z |
|---|---|---|---|---|---|
| 0 | $a_0$ | $b_0$ | $c_0$ | $r_0 = a_0 + b_0 + c_0$ | $z_0 = a_0 + 2b_2 + 2c_1$ |
| 1 | $a_1$ | $b_1$ | $c_1$ | $r_1 = a_1 + b_1 + c_1$ | $z_1 = a_1 + 2b_3 + c_0$ |
| 2 | $a_2$ | $b_2$ | $c_2$ | $r_2 = a_2 + b_2 + c_2$ | $z_2 = a_2 + b_0 + c_3$ |
| 3 | $a_3$ | $b_3$ | $c_3$ | $r_3 = a_3 + b_3 + c_3$ | $z_3 = a_3 + b_1 + 2c_2$ |

FIG. 5

|   | 0 | 1 | 2 | R | Z | $S_0$ | $S_1$ | $W = S_0 - S_1$ |
|---|---|---|---|---|---|---|---|---|
| 0 |   | $b_0 + e$ | $c_0$ | $r_0 = a_0 + b_0 + c_0$ | $z_0 = a_0 + 2b_2 + 2c_1$ | $-a_0 + e$ | $-a_0$ | $e$ |
| 1 |   | $b_1$ | $c_1$ | $r_1 = a_1 + b_1 + c_1$ | $z_1 = a_1 + 2b_3 + c_0$ | $-a_1$ | $-a_1$ | $0$ |
| 2 |   | $b_2$ | $c_2$ | $r_2 = a_2 + b_2 + c_2$ | $z_2 = a_2 + b_0 + c_3$ | $-a_2$ | $-a_2 + e$ | $-e$ |
| 3 |   | $b_3$ | $c_3$ | $r_3 = a_3 + b_3 + c_3$ | $z_3 = a_3 + b_1 + 2c_2$ | $-a_3$ | $-a_3$ | $0$ |

FIG. 6

FIG. 7

MDS ARRAY CODES WITH OPTIMAL BUILDING

CROSS-REFERENCES TO RELATED APPLICATIONS

This application is a non-provisional patent application and claims the benefit of U.S. Provisional Application No. 61/452,863 filed Mar. 15, 2011 entitled "MDS Array Codes with Optimal Building" and claims the benefit of U.S. Provisional Application No. 61/490,503 filed May 26, 2011 entitled "MDS Array Codes with Optimal Building". The disclosures of both provisional applications are hereby expressly incorporated by reference in their entirety for all purposes.

STATEMENT AS TO RIGHTS TO INVENTIONS MADE UNDER FEDERALLY SPONSORED RESEARCH OR DEVELOPMENT

This invention was made with government support under ECCS0802017 awarded by the National Science Foundation. The government has certain rights in the invention.

BACKGROUND

Data storage system with extremely large capacity have become commonplace and are typically structured as Redundant Arrays of Inexpensive Disks, or RAID. The fundamental structure of a RAID storage system is a collection of multiple disks (also referred to as drives) that are organized as an array in which read and write operations are performed under management of a RAID controller. If a disk drive in the array fails, causing an erasure, then the RAID controller can rebuild the erased data from the remaining disks. The RAID storage system stores data that it receives data from an external machine, referred to as a host computer, and retrieves data for delivery to a host computer, upon request. To the host computer, the RAID storage system appears to be a single logical hard disk.

The RAID controller manages the disks of the array according to configuration data received from a user, typically through a host computer. The configuration data includes, for example, the RAID level, how many disks are in the array, the drive identification names or numbers, the location of the data, and any other data required by the RAID controller to configure and manage the read, write, and rebuilding operations for the RAID array.

The disks in a RAID storage system include disks that contain data that a user wants to store and retrieve, called systematic data, and also include disks that contain redundancy information, called parity data, from which the RAID controller can rebuild any failed disks and recover from an erasure. The parity data is typically generated as a linear combination of data from the systematic disks, comprising redundancy values computed by calculating a function of predetermined word sizes from the data of the systematic disks. The parity data is stored on the parity disks. If a systematic disk fails, the data on the failed disk can be regenerated from the data stored on the parity drives and the remaining systematic disks. If a parity disk fails, its parity data can be reconstructed from the data stored on the systematic disks. Various codes have been proposed to provide efficient rebuilding of data upon suffering an erasure, but many conventional codes require relatively complicated or time-consuming parity computations. For example, Maximum Distance Separable (MDS) codes are proposed, as described further below, and provide improved storage efficiency.

Efficient codes are becoming more and more important as the size of RAID storage systems increases. For example, RAID storage systems may be structured so that the storage disks of the array are, in fact, nodes of a network, and not just single disk drives. That is, a RAID array may be comprised of network nodes, each of which may comprise a RAID array. Such high-density data storage systems urgently need more efficient storage codes. It is desired to improve the efficiency of RAID codes for read and write operations and rebuilding operations in RAID arrays.

Other features and advantages of the present disclosure should be apparent from the following description of exemplary embodiments, which illustrate, by way of example, aspects of the disclosure.

SUMMARY

The rebuilding ratio for multiple-node storage systems is improved. A controller as disclosed is configured for receiving configuration data at the controller that indicates operating features of the array and determining a parity code for operation of the array according to a permutation, wherein the configuration data specifies the array as comprising nodes defined by $A=(a_{i,j})$ with size $r^m \times k$ for some integers k, m, and wherein for $T=\{v_0, \ldots, v_{k-1}\} \subseteq Z_r^m$ a subset of vectors of size k, where for each $v=(v_1, \ldots, v_m) \in T$, $\gcd(v_1, \ldots, v_m, r)$, where gcd is the greatest common divisor, such that for any l, $0 \leq l \leq r-1$, and $v \in T$, the code values are determined by the permutation $f_v^l:[0, r^m-1] \to [0, r^m-1]$ by $f_v^1(x)=x+lv$.

Other features and advantages of the present invention should be apparent from the following description of exemplary embodiments, which illustrate, by way of example, aspects of the invention.

BRIEF DESCRIPTION OF THE DRAWINGS

FIG. 2 is a diagrammatic representation of permutations for zigzag sets in a (5, 3) code configured with four rows.

FIG. 4 shows a 2-duplication of the code in FIG. 3(a) and FIG. 3(b).

FIG. 5 shows a (5, 3) Zigzag code generating from a standard basis vector and the zero vector.

FIG. 6 shows an erroneous array of the (5, 3) Zigzag code of FIG. 5.

FIG. 7 shows a (6, 3) MDS array code with optimal ratio 1/3.

DETAILED DESCRIPTION

The contents of this Detailed Description are organized according to the following headings:
I. Introduction
II. Definitions and Problem Settings III. (k+2, k) MDS Array Code Constructions
IV. Code Duplication
V. Finite Field Size of a Code
VI. Decoding of the Codes
VII. Generalization of the Code Construction
VIII. Rebuilding Multiple Erasures
IX. Physical Implementation
X. Concluding Remarks Equations will be identified by a parenthetical numeral at the right end of a line of text, such as (1). Subheadings are not listed in this outline of headings.

I. Introduction

Erasure-correcting codes are the basis of the ubiquitous RAID schemes for storage systems, where disks correspond to symbols in the code. Specifically, RAID schemes are based on MDS (maximum distance separable) array codes that enable optimal storage and efficient encoding and decoding algorithms. With r redundancy symbols, an MDS code is able to reconstruct the original information if no more than r symbols are erased. An array code is a two dimensional array, where each column corresponds to a symbol in the code and is stored in a disk in the RAID scheme. We are going to refer to a disk/symbol as a node or a column interchangeably, and an entry in the array as an element. Examples of MDS array codes may be found in documents describing MDS array codes such as "EVENODD" see M. Blaum et al., *IEEE Trans. on Computers*, 44(2):192-202 (February 1995); and M. Blaum et al., *IEEE Trans. on Information Theory*, 42:529-542 (1996); "B-code" see L. Xu et al., *IEEE Trans. on Information Theory*, 45(6):1817-1826 (September 1999)3, "X-code" see L. Xu and J. Bruck, *IEEE Trans. on Information Theory*, 45(1):272-276 (1999), "RDP" see P. Corbett et al., in *Proc. of the 3rd USENIX Symposium on File and Storage Technologies* (FAST 04) (2004)5, and "STAR-code" see C. Huang and L. Xu, *IEEE Trans. on Computers*, 57(7):889-901 (2008).

Figure 1:
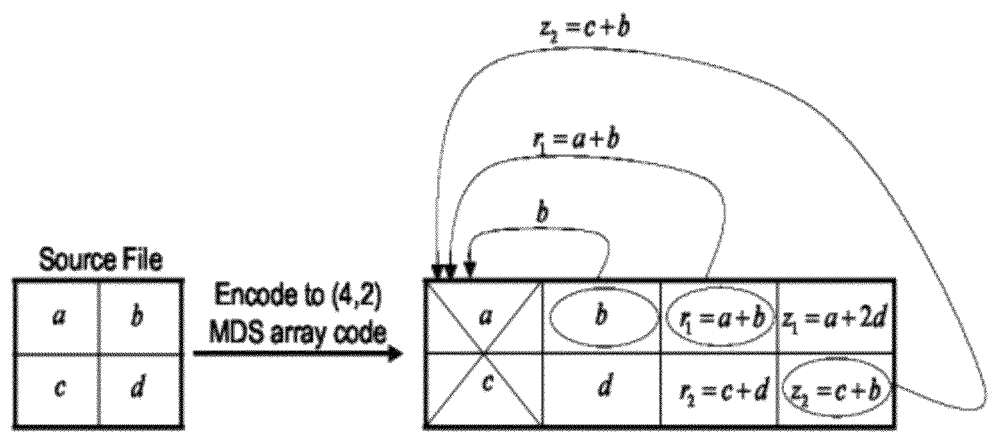
FIG. 1 is a diagrammatic representation of rebuilding a (4, 2) MDS array code.

Suppose that some nodes are erased in an systematic MDS array code. We will rebuild them by accessing (reading) some information in the surviving nodes, all of which are assumed to be accessible. The fraction of the accessed information in the surviving nodes is called the rebuilding ratio. If r nodes are erased, then the rebuilding ratio is 1, because we need to read all the remaining information. However, is it possible to lower this ratio for less than r erasures? For example, FIG. 1 shows the rebuilding of the first systematic (information) node for an MDS code with four information elements and two redundancy nodes, which requires the transmission (reading) of three elements. If the first column containing elements a and c is erased, then reading the three circled elements can provide the original elements a and c. That is, following the failure of the two elements a, c in the first column, it will be necessary to read three of the remaining six elements in the array. Thus, the rebuilding ratio is 1/2. In a storage system there is a difference between erasures of systematic and parity nodes. Erasure of the former will affect the information access time since part of the raw information is missing, however erasure of the latter does not have such effects, since the entire raw information is accessible. Moreover in most storage systems the number of parity nodes is negligible compared to the systematic ones. Therefore our construction focuses on optimally rebuilding the systematic nodes.

In documents such as A. Dimakis et al., *IEEE Trans. on Information Theory*, 56(9):4539-4551 (2010), and Y. Wu et al., in *Allerton Conference on Control, Computing, and Communication*, Urbana-Champaign, Ill. (2007), a related problem is discussed: the nodes are assumed to be distributed and fully connected in a network, and the repair bandwidth is defined as the minimum amount of data needed to transmit in the network in order to retain the MDS property. Note that one block of data transmitted can be a function of several blocks of data. In addition, retaining MDS property does not imply rebuilding the original erased node, whereas we restrict our problem to exact rebuilding. Therefore, the repair bandwidth is a lower bound of the rebuilding ratio.

An (n, k) MDS code has n nodes in each codeword and contains k nodes of information and r=n−k nodes of redundancy. A lower bound for the repair bandwidth was shown as [A. Dimakis et al., *IEEE Trans. on Information Theory*, 56(9): 4539-4551 (2010)]

$$\frac{M}{k} \cdot \frac{n-1}{n-k}, \quad (1)$$

where M is the total amount of information, and all the surviving nodes are assumed to be accessible. It can be verified that FIG. 1 matches this lower bound. A number of works addressed the repair bandwidth problem (see A. Dimakis et al., *IEEE Trans. on Information Theory*, 56(9):4539-4551 (2010); Y. Wu et al., in *Allerton Conference on Control, Computing, and Communication*, Urbana-Champaign, Ill. (2007); Y. Wu, in *ISIT* (2009); Y. Wu and A. Dimakis, in *ISIT* (2009); K. V. Rashmi et al., Tech Rep. arXiv:0906.4913 (2009); C. Suh and K. Ramchandran, Tech. Rep. arXiv:1001.0107 (January 2010); N. B. Shah et al., in *IEEE Information Theory Workshop* (*ITW*) (January 2010); C. Suh and K. Ramchandran, Tech. Rep. arXiv:1004.4663 (2010); V. R. Cadambe et al., Tech. Rep. arXiv:1004.4299 (2010); K. V. Rashmi et al., Tech. Rep. arXiv:1101.0133 (2010), and it was shown by interference alignment in documents such as C. Suh and K. Ramchandran, Tech. Rep. arXiv:1001.0107 (January 2010), N. B. Shah et al., in *IEEE Information Theory Workshop* (*ITW*) (January 2010) that this bound is asymptotically achievable for exact repair. Instead of trying to construct MDS codes that can be easily rebuilt, a different approach [see Z. Wang et al., in *IEEE GLOBECOM Workshops*, 1905-1909 (December 2010), and L. Xiang et al., in *ACM SIGMETRICS*, 119-130 (2010)] was used by trying to find ways to rebuild existing families of MDS array codes. The ratio of rebuilding a single systematic node was shown to be 3/4+o(1) for EVENODD or RDP codes, both of which have two parities. However, from the lower bound of (1) the ratio is 1/2. A related work for optimal rebuilding problem can be found in V. R. Cadambe et al., in *ISIT* (2011).

The main contribution of the present discussion is that it provides the first explicit construction of systematic (n,k) MDS array codes for any constant r=n−k, which achieves optimal rebuilding ratio of 1/r. Moreover, they also achieve optimal ratio of e/r when e systematic erasures occur, 1≤e≤r. We call them intersecting zigzag sets codes (IZS codes). The parity symbols are constructed by linear combinations of a set of information symbols, such that each information symbol is contained exactly once in each parity node. These codes have a variety of advantages: (1) they are systematic codes, and it is easy to retrieve information; (2) they have high code rate k/n, which is commonly required in storage systems; (3) the encoding and decoding of the codes can be easily implemented (for r=2, the code uses finite field of size three); (4) they match the lower bound of the ratio when rebuilding e systematic nodes; (5) the rebuilding of a failed node requires simple computation and access to only 1/r of the data in each node (no linear combination of data); and 6) they have optimal update, namely, when an information element is updated, only n−k+1 elements in the array need update.

The remainder of the paper is organized as follows. Section II gives definitions and some general observations on MDS array codes, and Section III constructs (k+2, k) MDS array codes with optimal rebuilding ratio. Section IV introduces code duplication and thus generates (k+2, k) MDS array codes for arbitrary number of columns. We discuss the size of the finite field needed for these constructions in Section V. Decoding in case of erasure and errors are discussed in VI. Section VII generalizes the MDS code construction to arbitrary number of parity columns. These generalized codes have similar properties as the (k+2, k) MDS array codes, likewise some of them has optimal ratio. Rebuilding of multiple erasures and generalization of the rebuilding algorithms are shown in Section VIII. Examples of physical implementations of the principles disclosed herein are shown in Section IX. Finally we provide concluding remarks in Section X.

II. Definitions and Problem Settings

In the rest of this document, we are going to use [i, j] to denote $\{i, i+1, \ldots, j\}$ and [i] to denote $\{1, 2, \ldots, j\}$, for integers i≤j. And denote the complement of a subset X⊆M as $\overline{X}$=M\X. For a matrix A, $A^T$ denotes the transpose of A. For a binary vector $v=(v_1, \ldots, v_n)$ we denote by $\overline{v}=(v_1+1 \bmod 2, \ldots, v_n+1 \bmod 2)$ its complement vector. The standard vector basis of dimension m will be denoted as $\{e_i\}_{i=1}^m$ and the zero vector will be denoted as $e_0$. For an integer n denote by $S_n$ the set of permutations over the integers [0, n−1]. For two functions $f$ and $g$, denote their composition by $fg$ or $f \circ g$.

Let us define a MDS array code with two parities. Let $A=(a_{i,j})$ be an array of size p×k over a finite field F, where i∈[0, p−1], j∈[0,k−1], and each of its entry is an information element. We add to the array two parity columns and obtain an (n=k+2, k) MDS code of array size p×n. Each element in these parity columns is a linear combination of elements from A. More specifically, let the two parity columns be $C_k(r_0, r_1, \ldots, r_{p-1})^T$ and $C_{k+1}(z_0, z_1, \ldots, z_{p-1})^T$. Let R=, $\{R_0, R_1, \ldots, R_{p-1}\}$ and Z=$\{Z_0, Z_1, \ldots, Z_{p-1}\}$ be two sets such that $R_l, Z_l$ are subsets of elements in A for all l∈[0, p−1]. Then for all l∈[0, p−1], define $r_l=\sum_{a \in R_l} \alpha_a a$ and $z_l=\sum_{a \in Z_l} \beta_a a$, for some sets of coefficients $\{\alpha_a\}, \{\beta_a\} \subseteq F$. We call R and Z as the sets that generate the parity columns.

We assume the code has optimal update, meaning that only 3 elements in the code are updated when an information element is updated. Under this assumption, the following theorem characterizes the sets R and Z.

Theorem 1. For an (k+2, k) MDS code with optimal update, the sets R and Z are partitions of A into p equally sized sets of size k, where each set in R or Z contains exactly one element from each column.

Proof: Since the code is a (k+2, k) MDS code, each information element should appear at least once in each parity column $C_k, C_{k+1}$. However, since the code has optimal update, each element appears exactly once in each parity column.

Let X∈R, note that if X contains two entries of A from the systematic column $C_i$, i∈[0,k−1], then rebuilding is impossible if columns $C_i$ and $C_{k+1}$ are erased. Thus X contains at most one entry from each column, therefore |X|≤k. However each element of A appears exactly once in each parity column, thus if |X|<k, X∈R, there is Y∈R, with |Y|>k, which leads to a contradiction since Y contains two elements from the same column. Therefore, |X|=k for all X∈R. As each information element appears exactly once in the first parity column, R=$\{R_0, \ldots, R_{p-1}\}$ is a partition of A into p equally sized sets of size k. Similar proof holds for the sets Z=$\{Z_0, \ldots, Z_{p-1}\}$.

Figure 2:
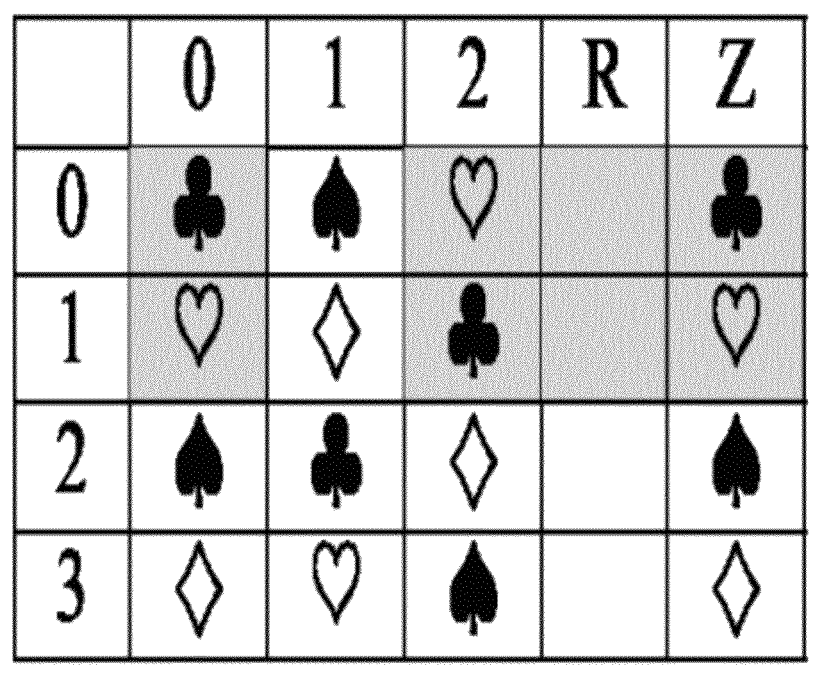

By the above theorem, for the j-th systematic column $(a_0, \ldots, a_{p-1})^T$, its p elements are contained in p distinct sets $R_l$, l∈[0, p−1]. In other words, the membership of the j-th column's elements in the sets $\{R_l\}$ defines a permutation $g_j:[0, p-1] \to [0, p-1]$, such that $g_j(i)=l$ iff $a_i \in R_l$. Similarly, we can define a permutation $f_j$ corresponding to the second parity column, where $f_j(i)=l$ iff $a_i \in Z_l$. For example, FIG. 2 is a diagrammatic representation 200 (in a table format) of permutations for zigzag sets in a (5, 3) code with four rows. Columns 0, 1, and 2 are systematic nodes containing data and columns R and Z are parity nodes. Each element in column R is a linear combination of the systematic elements in the same row, i.e., to the left. Each element in column Z is a linear combination of the systematic elements with the same symbol. The shaded elements are accessed to rebuild column 1. That is, each element in the parity column Z is a linear combination of elements with the same symbol. For instance the ♣ in column Z is a linear combination of all the ♣ elements in columns 0, 1, and 2. And each systematic column corresponds to a permutation of the four symbols.

Observing that there is no importance of the elements' ordering in each column, w.l.o.g. we can assume that the first parity column contains the sum of each row of A and $g_j$'s correspond to identity permutations, i.e. $r_i=\sum_{j=0}^{k-1} \alpha_{i,j} a_{i,j}$ for some coefficients $\alpha_{i,j}$. We refer to the first and the second parity columns as the row column and the zigzag column respectively, likewise $R_l$ and $Z_l$, l∈[0, p−1], are referred to as row sets and zigzag sets respectively. We will call $f_j$, j∈[0,k−1], zigzag permutations. By assuming that the first parity column contains the row sums, the code is uniquely defined by the following:

(1) The coefficients in the linear combinations.
(2) The zigzag permutations.

Then for our rebuilding problem, the desired properties of the code are:

(1) MDS.
(2) Minimized rebuilding ratio when one systematic node is erased.

Our approach consists of two steps: first we choose the appropriate zigzag sets $Z_0, \ldots Z_{p-1}$ in order to minimize the rebuilding ratio, and then we choose the coefficients in the linear combinations in order to make sure that the code is indeed an MDS code. But first we show that any set of zigzag sets Z=$\{Z_0, \ldots, Z_{p-1}\}$ defines a (k+2, k) MDS array code over a field F large enough. For that proof we use the well-known Combinatorial Nullstellensatz by Alon [see N. Alon, *Combinatorics Probability and Computing*, 8(1-2):7-29 (January 1999)], given by Theorem 2:

Theorem 2. (Combinatorial Nullstellensatz) Let F be an arbitrary field, and let $f=f(x_1, \ldots, x_q)$ be a polynomial in $F[x_1, \ldots, x_q]$. Suppose the degree of $f$ is $\deg(f)=\sum_{i=1}^q t_i$, where each $t_i$ is a nonnegative integer, and suppose the coefficient of $\Pi_{i=1}^q x_i^{t_i}$ in $f$ is nonzero. Then, if $S_1, \ldots, S_n$ are subsets of F with $|S_i|>t_i$, there are $s_1 \in S_1, s_2 \in S_2, \ldots, s_q \in S_q$ so that $$f(s_1, \ldots, s_q) \neq 0.$$

Theorem 3. Let $A=(a_{i,j})$ be an array of size p×k and the zigzag sets be Z=$\{Z_0, \ldots, Z_{p-1}\}$, then there exists a (k+2, k) MDS array code for A with Z as its zigzag sets over the field F of size greater than p(k−1)+1.

Proof: Assume the information of A is given in a column vector W of length pk, where column i∈[0,k−1] of A is in the row set [(ip+1, (i+1)p] of W. Each systematic node i, i∈[0,k−1], can be represented as $Q_i W$ where $Q_i=\lfloor 0_{p \times pi}, I_{p \times p}, 0^{p \times p(k-i-1)} \rfloor$. Moreover define $Q_k=\lfloor I_{p \times p} I_{p \times p}, \ldots, I_{p \times p} \rfloor$, $Q_{k+1}= [x_0 P_0, x_1 P_1, \ldots, x_{k-1} P_{k-1}]$ where the $P_i$'s are permutation matrices (not necessarily distinct) of size p×p, and the $x_i$'s are variables, such that $C_k = Q_k W$, $C_{k+1} = Q_{k+1} W$. The permutation matrix $P_i = (p_{l,m}^{(i)})$ is defined as $p_{l,m}^{(i)} = 1$ if and only if $a_{m,l} \in Z_l$. In order to show that there exists such MDS code, it is sufficient to show that there is an assignment for the intermediates $\{x_i\}$ in the field F, such that for any set of integers $\{s_1, s_2, \ldots, s_k\} \subseteq [0, k+1]$ the matrix $Q = [Q_{s_1}^T, Q_{s_2}^T, \ldots, Q_{s_k}^T]$ is of full rank. It is easy to see that if the parity column $C_{k+1}$ is erased, i.e., $k+1 \notin \{s_1, s_2, \ldots, s_k\}$ then Q is of full rank. If $k \notin \{s_1, s_2, \ldots, s_k\}$ and $k+1 \in \{s_1, s_2, \ldots, s_q\}$ then Q is of full rank if none of the $x_i$'s equals to zero. The last case is when both $k, k+1 \in \{s_1, s_2, \ldots, s_k\}$, i.e., there are $0 \le i \le j \le k-1$ such that $i, j \notin \{s_1, s_2, \ldots, s_k\}$. It is easy to see that in that case $Q$ is of full rank if and only if the submatrix $$B_{i,j} = \begin{pmatrix} x_i P_i & x_j P_j \\ I_{p \times p} & I_{p \times p} \end{pmatrix}$$

is of full rank. This is equivalent to $\det(B_{i,j}) \ne 0$. Note that $\deg(\det(B_{i,j})) = p$ and the coefficient of $x_i^p$ is $\det(P_i) \in \{1, -1\}$. Define the polynomial $$T = T(x_0, x_1, \ldots, x_{k-1}) = \prod_{0 \le i < j \le k-1} \det(B_{i,j}),$$

and the result follows if there are elements $a_0, a_1, \ldots, a_{k-1} \in F$ such that $T(a_0, a_1, \ldots, a_{k-1}) \ne 0$. T is of degree $p\binom{k}{2}$ and the coefficient of $\prod_{i=0}^{k-1} x_i^{p(k-1-i)}$ is $\prod_{i=0}^{k-1} \det(P_i)^{k-1-i} \ne 0$. Set for any i, $S_i = F \backslash 0$ in Theorem 2, and the result follows.

The above theorem states that there exist coefficients such that the code is MDS, and thus we will focus first on finding proper zigzag permutations $\{f_i\}$. The idea behind choosing the zigzag sets is as follows: assume a systematic column $(a_0, a_1, \ldots, a_{p-1})^T$ is erased. Each element $a_i$ is contained in exactly one row set and one zigzag set. For rebuilding of element $a_i$, access the parity of its row set or zigzag set. Moreover access the values of the remaining elements in that set, except $a_i$. We say that an element $a_i$ is rebuilt by a row (zigzag) if the parity of its row set (zigzag set) is accessed. For example, in FIG. 2, supposing column 1 is erased, one can access the shaded elements and rebuild its first two elements by rows, and the rest by zigzags. The set $S = \{S_0, S_1, \ldots, S_{p-1}\}$ is called a rebuilding set for column $(a_0, a_1, \ldots, a_{p-1})^T$ if for each i, $S_i \in R \cup Z$ and $a_i \in S_i$. In order to minimize the number of accesses to rebuild the erased column, we need to minimize the size of $$|\cup_{i=0}^{p-1} S_i|, \qquad (2)$$

which is equivalent to maximizing the number of intersections between the sets $\{S_i\}_{i=0}^{p-1}$. More specifically, the intersections between the row sets in S and the zigzag sets in S. For the rebuilding of node i by S, define the number of intersections by $$I(i|S) = \sum_{S \in S} |S| - \left| \bigcup_{S \in S} S \right| = pk - |\cup_{S \in S} S|.$$

Moreover define the number of total intersections in an MDS array code C as $$I(C) = \sum_{i=0}^{k-1} \max_{S \text{ rebuilds } i} I(i|S).$$

Now define h(k) to be the maximal possible intersections over all (k+2, k) MDS array codes, i.e., $$h(k) = \max_C I(C).$$

For example, in FIG. 2 the rebuilding set for column 1 is $S = \{R_0, R_1, Z_0, Z_1\}$, the size in equation (2) is 8, and $I(1|S) = 4$. Note that each surviving node accesses exactly one-half of its information without performing any calculation within it.

The following theorem gives a recursive bound for the maximal number of intersections.

Theorem 4. Let $q \le k \le p$, then $$h(k) \frac{k(k-1)h(q)}{q(q-1)}.$$

Proof: Let A be an information array of size p×k. Construct a MDS array code C by the row sets and the zigzag sets that reaches the maximum possible number of intersections, and suppose $S^i$ achieves the maximal number of intersections for rebuilding column i, $i \in [0, k-1]$. Namely the zigzag sets Z of the code C and the rebuilding sets $S^i$ satisfy that, $$h(k) = I(C) = \sum_{i=0}^{k-1} \max_{S \text{ rebuilds } i} I(i|S) = \sum_{i=0}^{k-1} I(i|S^i).$$

For a subset of columns $T \subseteq [0, k-1]$ and a rebuilding set $S^i = \{S_0, \ldots, S_{p-1}\}$ we define the restriction of $S^i$ to T by $S_T^i = \{S_{0,T}, \ldots, S_{p-1,T}\}$, which are the sets of elements in columns T. Denote by $$I(j, S^i) = \sum_{i=0}^{p-1} |S_i \cap j| - \left| \left( \bigcup_{i=0}^{p-1} S_i \right) \cap j \right|$$

the number of intersections in column j while rebuilding column i by $S^i$. It is easy to see that $$I(i|S^i) = \sum_{j: j \ne i} I(j, S^i)$$

and thus $$h(k) = \sum_{i,j: j \ne i} I(i, S^i).$$

Note also that if $i \ne j$ and $i, j \in T$, then Equation (3) gives:

$$I(j, S^i) = I(j, S_T^i). \qquad (3)$$

Hence $$\binom{k-2}{q-2}h(k) = \binom{k-2}{q-2}\sum_{\substack{i,j:\\j\neq i}} I(j, S^i)$$

$$= \sum_{\substack{i,j:\\j\neq i}} \sum_{\substack{T\subseteq[0,k-1]:\\i,j\in T, |T|=q}} I(j, S^i)$$

$$= \sum_{\substack{i,j:\\j\neq i}} \sum_{\substack{T\subseteq[0,k-1]:\\i,j\in T, |T|=q}} I(j, S^i_T)$$

$$= \sum_{\substack{T\subseteq[0,k-1]:\\|T|=q}} \sum_{\substack{i,j\in T:\\i\neq j}} I(j, S^i_T)$$

$$\leq \sum_{\substack{T\subseteq[0,k-1]\\|T|=q}} h(q) \quad (4)$$

$$= \binom{k}{q}h(q).$$

Inequality (4) above holds because the code restricted in columns T is a (q+2, q) MDS and optimal-update code, and h(q) is the maximal intersections among such codes. Hence, $$h(k) \leq \frac{\binom{k}{q}h(q)}{\binom{k-2}{q-2}} = \frac{k(k-1)h(q)}{q(q-1)},$$

and the result follows.

For a (k+2, k) MDS code C with p rows define R(C) as the rebuilding ratio as the average fraction of accesses in the surviving systematic and parity nodes while rebuilding one systematic node, i.e., $$R(C) = \frac{k(p(k-1) - I(C) + p)}{p(k+1)k} = 1 - \frac{I(C) + pk}{p(k+1)k}.$$

Notice that in the two parity nodes, we access p elements because each erased element must be rebuilt either by row or by zigzag. Thus we have the term p in the above definition. Define the ratio function for all (k+2, k) MDS codes with p rows as $$R(k) = \min_{C} R(C) = 1 - \frac{h(k) + pk}{p(k+1)k},$$

which is the minimal average portion of the array needed to be accessed in order to rebuild one erased column.

Theorem 5. R(k) is no less than 1/2 and is a monotone nondecreasing function.

Proof: Consider a (k+2, k) code with p rows and assume a systematic node is erased.

In order to rebuild it, p row and zigzag sets are accessed. Let x and p−x be the number of elements that are accessed from the first and the second parity respectively. W.l.o.g we can assume that $$x \geq \frac{p}{2},$$

otherwise p−x would satisfy it. Each element of these x sets is a sum of a set of size k. Thus in order to rebuild the node, we need to access at least $$x(k-1) \geq \frac{p(k-1)}{2}$$

elements in the k−1 surviving systematic nodes, which is at least half of the size of these nodes. So the number of intersections is no more than $$\frac{pk(k-1)}{2}.$$

Thus $$h(k) \leq \frac{pk(k-1)}{2}. \quad (5)$$

and the ratio function satisfies $$R(k) = 1 - \frac{h(k) + pk}{pk(k+1)} \geq 1 - \frac{\frac{pk(k-1)}{2} + pk}{pk(k+1)} = \frac{1}{2}.$$

So the rebuilding ratio is no less than 1/2.

From Theorem 4 we get the following in Equation (6), $$h(k-1) \leq \frac{(k+1)kh(k)}{k(k-1)} = \frac{(k+1)h(k)}{(k-1)}. \quad (6)$$

Hence, $$R(k+1) = 1 - \frac{h(k+1)}{p(k+1)(k+2)} - \frac{1}{k+2}$$

$$\geq 1 - \frac{h(k)}{p(k-1)(k+2)} - \frac{1}{k+2}$$

$$= 1 - \frac{h(k) + p(k-1)}{p(k-1)(k+2)}$$

$$\geq 1 - \frac{h(k) + pk}{pk(k+1)}$$

$$= R(k),$$

where Equation (7) follows from Equation (5). Thus the ratio function is nondecreasing.

The lower bound of 1/2 in the previous theorem can be also derived from (1). For example, it can be verified that for the code in FIG. 2, all the three systematic columns can be rebuilt by accessing half of the remaining elements. Thus the code achieves the lower bound 1/2, and therefore R(3)=1/2. Moreover, we will see in Corollary 11 that R(k) is almost 1/2 for all k and p=$2^l$, where l is large enough.

III. (k+2, k) MDS Array Code Constructions

The previous section gave us a lower bound for the ratio function. The question is can we achieve it? If so, how? We know that each (k+2, k) MDS array code with row and zigzag columns is defined by a set of permutations $f_0, \ldots, f_{k-1}$. The following construction constructs a family of such MDS array codes. From any set $T \subseteq F_2^m$, $|T|=k$, we construct a (k+2, k) MDS array code of size $2^m \times (k+2)$. The ratio of the constructed code will be proportional to the size of the union of the elements in the rebuilding set in Equation (2). Thus we will try to construct such permutations and subsets that minimize the union. We will show that some of these codes have the optimal ratio of 1/2.

In this section all the calculations are done over $F_2$. By notation herein we use $x \in [0, 2^m-1]$ both to represent the integer and its binary representation. It will be clear from the context which meaning is in use.

Construction 1. Let $A = (a_{i,j})$ be an array of size $2^m \times k$ for some integers k, m, and $k \leq 2^m$. Let $T \subseteq F_2^m$ be a subset of vectors of size k which does not contain the zero vector. For $v \in T$ we define the permutation $f_v: [0, 2^m-1] \to [0, 2^m-1]$ by $f_v(x) = x+v$, where x is represented in its binary representation. One can check that this is actually a permutation. For example when m=2, v=(1,0)

$$f_{(1,0)}(3) = (1,1) + (1,0) = (0,1) = 1.$$

One can check that the permutation $f_v$ in vector notation is [2,3,0,1]. In addition, we define $X_v$ as the set of integers x in $[0, 2^m-1]$ such that the inner product between their binary representation and v satisfies $x \cdot v = 0$, e.g., $X_{(1,0)} = \{0, 1\}$. The construction of the two parity columns is as follows: The first parity column is simply the row sums. The zigzag sets $Z_0, \ldots, Z_{2^m-1}$ are defined by the permutations $\{f_{v_j}: v_j \in T\}$ as $a_{i,j} \in Z_l$ if $f_{v_j}(i) = l$. We will denote the permutation $f_{v_j}$ as $f_j$. Assume column j is erased, and define $S_r = \{a_{i,j}: i \in X_j\}$ and $S_z = \{a_{i,j}: i \notin X_j\}$. Rebuild the elements in $S_r$ by rows and the elements in $S_z$ by zigzags.

Recall that by Theorem 3 this code can be an MDS code over a field large enough. The following theorem gives the ratio for Construction 1.

Theorem 6. The code described in Construction 1 and generated by the vectors $v_0, v_1, \ldots, v_{k-1}$ is a (k+2, k) MDS array code with ratio $$R = \frac{1}{2} + \frac{\sum_{i=0}^{k-1} \sum_{j \neq i} |f_i(X_i) \cap f_j(X_i)|}{2^m k(k+1)}. \quad (8)$$

Proof: In rebuilding of node i we rebuild the elements in rows $X_i$ by rows, thus the row parity column accesses the values of the sum of rows $X_i$. Moreover, each surviving systematic node accesses its elements in rows $X_i$. Hence, by now $|X_i|k = 2^{m-1}k$ elements are accessed, and we manage to rebuild the elements of node i in rows $X_i$. The elements of node i in rows $\overline{X_i}$ are rebuilt by zigzags, thus the zigzag parity column accesses the values of the zigzags sums $\{z_{f_i(l)}: l \in \overline{X_i}\}$, and each surviving systematic node accesses the elements of these zigzags from its column, unless these elements are already included in the rebuilding by rows. The zigzag elements in $\{Z_{f_i(l)}: l \in \overline{X_i}\}$ of node j are in rows $f_j^{-1}(f_i(\overline{X_i}))$, thus the extra elements node j needs to access are in rows $f_j^{-1}(f_i(\overline{X_i})) \setminus X_i$. But, $$|f_j^{-1}(f_i(\overline{X_i})) \setminus X_i|$$

$$= |\overline{f_j^{-1}(f_i(X_i))} \cap \overline{X_i}|$$

$$= |f_j^{-1}(f_i(X_i)) \cup X_i|$$

$$= 2^m - |f_j^{-1}(f_i(X_i)) \cup X_i|$$

$$= 2^m - (|f_j^{-1}(f_i(X_i))| + |X_i| - |f_j^{-1}(f_i(X_i)) \cap X_i|)$$

$$= |f_j^{-1}(f_i(X_i)) \cap X_i|$$

$$= |f_i(X_i) \cap f_j(X_i)|,$$

where we used the fact that $f_i, f_j$ are bijections, and $|X_i| = 2^{m-1}$. Hence in a rebuilding of node i the number of elements to be accessed is $2^{m-1}(k+1) + \sum_{j \neq i} |f_i(X_i) \cap f_j(X_i)|$. The result follows by dividing by the size of the remaining array $2^m(k+1)$ and averaging over all systematic nodes.

The following lemma will help us to calculate the sum in Equation (8). Define $|v \setminus u| = \sum_{i: v_i = 1, u_i = 0} 1$ as the number of coordinates at which v has a 1 but u has a 0. Lemma 7 for any $0 \neq v$, $u \in T$ $$|f_v(X_v) \cap f_u(X_v)| = \begin{cases} |X_v|, & |v \setminus u| \mod 2 = 0 \\ 0, & |v \setminus u| \mod 2 = 1. \end{cases} \quad (9)$$

Proof: Consider the group $(F_2^m, +)$. Recall that $f_v(X) = X + v = \{x+v : x \in X\}$. The sets $f_v(X_v) = X_v + v$ and $f_u(X_v) = X_v + u$ are cosets of the subgroup $X_v = \{w \in F_2^m : w \cdot v = 0\}$, and they are either identical or disjoint. Moreover, they are identical iff $v - u \in X_v$, namely $(v-u) \cdot v = \sum_{i: v_i = 1, u_i = 0} 1 \equiv 0 \mod 2$. However, by definition $|v \setminus u| \equiv \sum_{i: v_i = 1, u_i = 0} 1 \mod 2$, and the result follows.

This construction enables us to construct an MDS array code from any subset of vectors in $F_2^m$. However, it is not clear which subset of vectors should be chosen. The following is an example of a code construction for a specific set of vectors.

Example 1

Let $T = \{v \in F_2^m : \|v\|_1 = 3\}$ be the set of vectors with weight 3 and length m. Notice that $|T| = \binom{m}{3}$. Construct the code C by T according to Construction 1. Given $v \in T$, $$|\{u \in T : |v \setminus u| = 3\}| = \binom{m-3}{3},$$

which is the number of vectors with 1's in different positions as v. Similarly, $$|\{u \in T : |v \setminus u| = 2\}| = 3\binom{m-3}{2}$$

and $|\{u \in T : |v \setminus u| = 1\}| = 3(m-3)$. By Theorem 6 and Lemma 7, for large m the ratio is $$\frac{1}{2} + \frac{2^{m-1}\binom{m}{3}3\binom{m-3}{2}}{2^m\binom{m}{3}\left(\binom{m}{3}+1\right)} \approx \frac{1}{2} + \frac{9}{2m}.$$

Note that this code reaches the lower bound of the ratio as m tends to infinity. In the following we will construct codes that reach the lower bound exactly.

Let $\{f_0, \ldots, f_{k-1}\}$ be a set of permutations over the set $[0,2^m-1]$ with associated subsets $X_0, \ldots, X_{k-1} \subseteq [0,2^m-1]$, where each $|X_i|=2^{m-1}$. We say that this set is a set of orthogonal permutations if for any i, j∈[0,k−1] and $$\frac{|f_i(X_i) \cap f_j(X_j)|}{2^{m-1}} = \delta_{i,j},$$

where $\delta_{i,j}$ is the Kronecker delta. The following theorem constructs a set of orthogonal permutations of size m+1 using the standard basis vectors and the zero vector.

Theorem 8. The permutations $f_0, \ldots, f_m$ and sets $X_0, \ldots, X_m$ constructed by the vectors $\{e_j\}_{j=0}^m$ and Construction 1 where $X_0$ is modified to be $X_0=\{x \in F_2^m : x \cdot (1, 1, \ldots, 1)=0\}$ is a set of orthogonal permutations. Moreover the $(m+3, m+1)$ MDS array code of array size $2^m \times (m+3)$ defined by these permutations has optimal ratio of 1/2. Hence, $R(m+1)=1/2$.

Proof: Since $|e_i \setminus e_j|=1$ for any $i \neq j \neq 0$, we get by Lemma 7 that $$f_i(X_i) \cap f_j(X_j) = \emptyset.$$

Note that $f_i(X_i)=\{x+e_i:x \cdot e_i=0\}=\{y:y \cdot e_i=1\}$, so $$f_i(X_i) \cap f_0(X_i)=\{y:y \cdot e_i=1\} \cap \{x:x \cdot e_i=0\}=\emptyset.$$

Similarly, $f_i(X_0)=\{x+e_i:x \cdot (1, 1, \ldots, 1)=0\}=\{y:y \cdot (1, 1, \ldots, 1)=1\}$, and $$f_0(X_0) \cap f_i(X_0) = \{x:x \cdot (1, \ldots, 1) = 0\} \cap \{y:y \cdot (1, \ldots, 1) = 1\}$$
$$= \phi.$$

Hence the permutations $f_0, \ldots, f_m$ are orthogonal permutations and the ratio is 1/2 by Theorem 6.

Note that the optimal code can be shortened by removing some systematic columns and still retain an optimal ratio, i.e., for any $k \leq m+1$ we get $R(k)=1/2$. Actually this set of *orthogonal* permutations is optimal in *size*, as the following theorem *suggests*.

Theorem 9. Let F be an orthogonal set of permutations over the integers $[0,2^m-1]$, then the size of F is at most m+1.

Proof: We will prove it by induction on m. For m=0 there is nothing to prove. Let $F=\{f_0, f_1, \ldots, f_{k-1}\}$ be a set of orthogonal permutations over the set $[0,2^m-1]$. We only need to show that $|f|=k \leq m+1$. It is trivial to see that for any g, h∈$S_{2^m}$ set $hFg=\{hf_0g, hf_1g, \ldots, hf_{k-1}g\}$ is also a set of orthogonal permutations with sets $g^{-1}(X_0), g^{-1}(X_1), \ldots, g^{-1}(X_{k-1})$. Thus w.l.o.g. we can assume that $f_0$ is the identity permutation and $X_0=[0,2^{m-1}-1]$. From the orthogonality we get that $$\cup_{i=1}^{k-1} f_i(X_0) = \overline{X_0} = [2^{m-1}, 2^m-1].$$

We claim that for any i≠0,

$$|X_i \cap X_0| = \frac{|X_0|}{2} = 2^{m-2}.$$

Assume the contrary, thus w.l.o.g we can assume that $|X_i \cap X_0|>2^{m-2}$, otherwise $|X_i \cap \overline{X_0}|>2^{m-2}$. For any j≠i≠0 we get that $$f_j(X_i \cap X_0), f_i(X_i \cap X_0) \subseteq \overline{X_0}, \quad (10)$$

$$|f_j(X_i \cap X_0)| = |f_i(X_i \cap X_0)| > 2^{m-2} = \frac{|\overline{X_0}|}{2}. \quad (11)$$

From equations (10) and (11) we conclude that $f_j(X_i \cap X_0) \cap f_i(X_i \cap X_0) \neq \emptyset$, which contradicts the orthogonality property. Define the set of permutations $F^*=\{f_i^*\}_{i=1}^{k-1}$ over the set of integers $[0,2^{m-1}-1]$ by $f_i^*(x)=f_i^*(x)-2^{m-1}$, which is a set of orthogonal permutations with sets $\{X_i \cap X_0\}_{i=1}^{k-1}$. By induction k−1≤m and the result follows.

The above theorem implies that the number of rows has to be exponential in the number of columns in any systematic code with optimal ratio and optimal update. Notice that the code in Theorem 8 achieves the maximum possible number of columns, m+1. An exponential number of rows is practical in storage systems, since they are composed of dozens of nodes (disks) each of which has size in an order of gigabytes. In addition, increasing the number of columns can be done using duplication (Theorem 10) or a larger set of vectors (Example 1) with a cost of a small increase in the ratio.

Example 2

Figure 3:
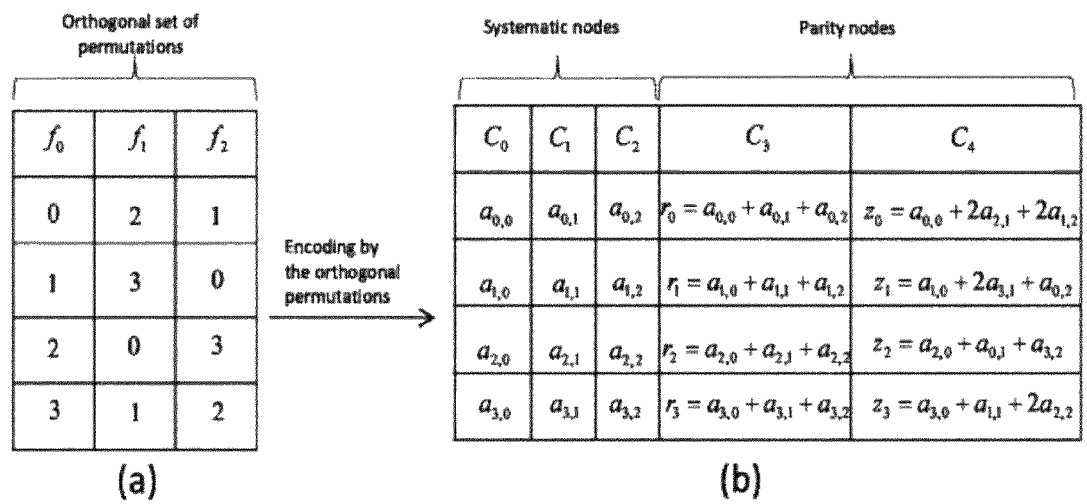
FIG. 3(a) shows a set of orthogonal permutations as in Theorem 8 with sets $X_0=\{0, 3\}$, $X_1=\{0, 1\}$, $X_2=\{0, 2\}$.
FIG. 3(b) shows a (5, 3) MDS array code generated by the orthogonal permutations.

Let A be an array of size 4×3. We construct a (5, 3) MDS array code for A as in Theorem 8 that accesses 1/2 of the remaining information in the array to rebuild any systematic node (see FIG. 3). For example, $X_1=\{0, 1\}$, and for rebuilding of node 1 (column $C_1$) we access the elements $a_{0,0}, a_{0,2}, a_{1,0}, a_{1,2}$, and the following four parity elements $r_0=a_{0,0}+a_{0,1}+a_{0,2}$ $r_1=a_{1,0}+a_{1,1}+a_{1,2}$ $z_{f_1(2)}=z_0=a_{0,0}+2a_{2,1}+2a_{1,2}$ $z_{f_1(3)}=z_1+a_{1,0}+2a_{3,1}+a_{0,2}.$ It is trivial to rebuild node 1 from the accessed information. Note that each of the surviving node accesses exactly 1/2 of its elements. It can be easily verified that the other systematic nodes can be rebuilt the same way. With reference to FIG. 3(a) and FIG. 3(b), rebuilding a parity node is easily achieved by accessing all the information elements. FIG. 3(a) shows a set of orthogonal permutations as in Theorem 8, with sets $X_0=\{0, 3\}, X_1=\{0, 1\}, X_2=\{0, 2\}$. FIG. 3(b) shows a (5, 3) MDS array code generated by the orthogonal permutations, as indicated by the arrow from FIG. 3(a) to FIG. 3(b). The first parity column $C_3$ is the row sum and the second parity column $C_4$ is generated by the zigzags. For example, zigzag $z_0$ contains the elements $a_{i,j}$ that satisfy $f_j(i)=0$.

IV. Code Duplication

In this section, we are going to increase the number of columns in the constructed (k+2, k) MDS codes, such that k does not depend on the number of rows, and ratio is approximately 1/2.

Figure 4:
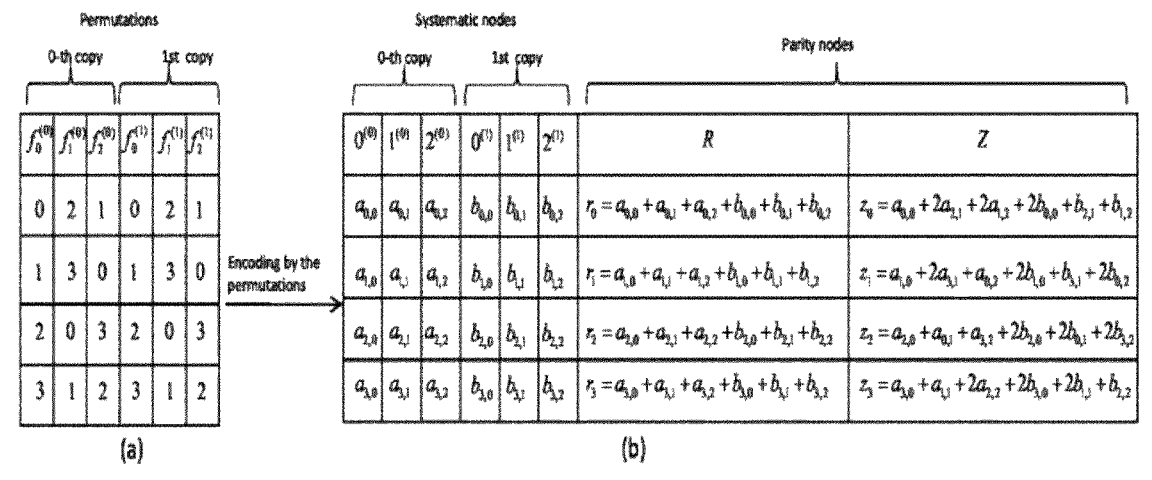

Let C be a (k+2, k) array code with p rows, where the zigzag sets $\{Z_l\}_{l=0}^{p-1}$ are defined by the set of permutations $\{f_i\}_{i=0}^{k-1} \subseteq S_p$. For an integer s, an s-duplication code C' is an (sk+2, sk) MDS code with zigzag permutations defined by duplicating the k permutations s times each, and the first parity column is the row sums. In order to make the code MDS, the coefficients in the parities may be different from the code C. For an s-duplication code, denote the column corresponding to the t-th $f_j$ as column $j^{(t)}$, $0 \leq t \leq s-1$. Call the columns $\{j^{(t)}: j \in [0, k-1]\}$ the t-th copy of the original code. An example of a 2-duplication of the code in FIG. 3 is illustrated in FIG. 4. FIG. 4 shows that the code has six information (systematic) nodes, and two parity nodes, R and Z. The ratio, in accordance with Theorem 10 below, is 4/7.

Theorem 10. If a (k+2, k) code C has ratio R(C), then its s-duplication code C' has ratio $$R(C) = \left(1 + \frac{s-1}{sk+1}\right).$$

Proof: We propose a rebuilding algorithm for C' with ratio of $$R(C) = \left(1 + \frac{s-1}{sk+1}\right),$$

which will be shown to be optimal.

Suppose in the optimal rebuilding algorithm of C, for column i, elements of rows $J=\{j_1, j_2, \ldots, j_u\}$ are rebuilt by zigzags, and the rest by rows. In C', all the s columns corresponding to $f_i$ are rebuilt in the same way: the elements in rows J are rebuilt by zigzags.

W.l.o.g. assume column $i^{(0)}$ is erased. Since column $i^{(t)}$, $t \in [1, s-1]$ corresponds to the same zigzag permutation as the erased column, for the erased element in the l-th row, no matter if it is rebuilt by row or by zigzag, we have to access the element in the l-th row and column $i^{(t)}$ (e.g. permutations $f_0^{(0)}, f_0^{(1)}$ and the corresponding columns $0^{(0)}, 0^{(1)}$ in FIG. 4). Hence all the elements in column $i^{(t)}$ must be accessed. Moreover, the optimal way to access the other surviving columns cannot be better than the optimal way to rebuild in the code C. Thus the proposed algorithm has optimal rebuilding ratio.

When column $i^{(0)}$ is erased, the average (over all $i \in [0, k-1]$) of the number of elements needed to be accessed in columns $l^{(t)}$, for all $l \in [0, k-1]$, $l \neq i$ and $t \in [0, s-1]$ is $R(C)p(k+1)-p$.

Here the term $-p$ corresponds to the access of the parity nodes in C. Moreover, we need to access all the elements in columns $i^{(t)}$, $0 < t \leq s-1$, and access p elements in the two parity columns. Therefore, the rebuilding ratio is $$R(C') = \frac{s(R(C)p(k+1)-p)+(s-1)p+p}{p(sk+1)}$$
$$= R(C)\frac{s(k+1)}{sk+1}$$
$$= R(C)\left(1 + \frac{s-1}{sk+1}\right)$$

and the proof is completed.

Theorem 10 gives us the ratio of the s-duplication of a code C as a function of its ratio R(C). As a result, for the optimal-ratio code in Theorem 8, the ratio of its duplication code is slightly more than 1/2, as the following corollary suggests.

Corollary 11. The s-duplication of the code in Theorem 8 has ratio $$\frac{1}{2}\left(1 + \frac{s-1}{s(m+1)+1}\right),$$

which is $$\frac{1}{2} + \frac{1}{2(m+1)}$$

for large s.

For example, we can rebuild the column $1^{(0)}$ in FIG. 4 by accessing the elements in rows $\{0, 1\}$ and in columns $0^{(0)}$, $2^{(0)}$, $0^{(1)}$, $2^{(1)}$, R, Z, and all the elements in column $1^{(1)}$. The rebuilding ratio for this code is 4/7.

Using duplication we can have arbitrarily large number of columns, independent of the number of rows. Moreover the above corollary shows that it also has an almost optimal ratio.

Next we will show that if we restrict ourselves to codes constructed using Construction 1 and duplication, the code using the standard basis and duplication has optimal asymptotic rate.

In order to show that, we define a related graph. Define the directed graph $D_m = D_m(V, E)$ as $V = \{w \in F_2^m : w \neq 0\}$, and $E = \{(w_1/w_2) : |w_2 \backslash w_1| \equiv 1 \mod 2\}$. Hence the vertices are the non-zero binary vectors of length m, and there is a directed edge from $w_1$ to $w_2$ if $|w_2 \backslash w_1|$ is odd size. From any induced subgraph H of $D_m$, we construct the code C(H) from the vertices of H using Construction 1. By Lemma 7 we know that a directed edge from $w_1$ to $w_2$ in H means $f_{w_2}(X_{w_2}) \cap f_{w_1}(X_{w_2}) = \emptyset$, so only half of the information from the column corresponding to $w_1$ is accessed while rebuilding the column corresponding to $w_2$. For a directed graph $D=D(V, E)$, let S and T be two disjoint subsets of its vertices. We define the density of the set S to be $$d_S = \frac{E_S}{|S|^2}$$

and the density between S and T to be $$d_{S,T} = \frac{E_{S,T}}{2|S||T|},$$

where $E_S$ is the number of edges with both of its endpoints in S, and $E_{S,T}$ is the number of edges incident with a vertex in S and a vertex in T. The following theorem shows that the asymptotic ratio of any code constructed using Construction 1 and duplication is a function of the density of the corresponding graph H.

Theorem 12. Let H be an induced subgraph of $D_m$. Let $C_s(H)$ be the s-duplication of the code constructed using the vertices of H and Construction 1. Then the asymptotic ratio of $C_s(H)$ is $$\lim_{s\to\infty} R(C_s(H)) = 1 - \frac{d_H}{2}$$

Proof: Let the set of vertices and edges of H be V(H)={$v_i$} and E(H) respectively. Denote by $v_i^l$, $v_i \in V(H)$, $l \in [0, s-1]$, the l-th copy of the column corresponding to the vector $v_i$. In the rebuilding of column $v_i^l$, $l \in [0, s-1]$, each remaining systematic column $v_j^k$, $k \in [0, s-1]$, needs to access all of its $2^m$ elements unless $|v_i \backslash v_j|$ is odd, and in that case it only has to access $2^{m-1}$ elements. Hence the total amount of accessed information for rebuilding this column is $$(s|V(H)|-1)2^m - \deg^+(v_i)s2^{m-1},$$

where $\deg^+$ is the indegree of $v_i$ in the induced subgraph H. Averaging over all the columns in $C_s(H)$ we get the ratio:

$$R(C_s(H)) = \frac{\sum_{v_i^l \in C_s(H)}(s|V(H)|-1)2^m - \deg^+(v_i)s2^{m-1}}{s|V(H)|(s|V(H)|+1)2^m}$$

$$= \frac{s|V(H)|(s|V(H)|-1)2^m - s^2 \sum_{v_i \in V(H)} \deg^+(v_i)2^{m-1}}{s|V(H)|(s|V(H)|+1)2^m}$$

$$= \frac{s|V(H)|(s|V(H)|-1)2^m - s^2|E(H)|2^{m-1}}{s|V(H)|(s|V(H)|+1)2^m}$$

Hence $$\lim_{s\to\infty} R(C_s(H)) = 1 - \frac{|E(H)|}{2|V(H)|^2} = 1 - \frac{d_H}{2}.$$

We conclude from Theorem 12 that the asymptotic ratio of any code using duplication and a set of binary vectors {$v_i$} is a function of the density of the corresponding induced subgraph of $D_m$ with {$v_i$} as its vertices. Hence the induced subgraph of $D_m$ with maximal density corresponds to the code with optimal asymptotic ratio. It is easy to check that the induced subgraph with its vertices as the standard basis $\{e_i\}_{i=1}^m$ has density $$\frac{m-1}{m}.$$

In fact this is the maximal possible density among all the induced subgraph as Theorem 14 suggests, but in order to show it we will need the following technical lemma.

Lemma 13. Let D=D(V, E) be a directed graph and S, T be a partition of V, i.e., $S \cap T = \emptyset$, $S \cup T = V$, then $$d_v \le \max\{d_S, d_T, d_{S,T}\}$$

Proof: Note that $$d_V = \frac{|S|^2 d_S + |T|^2 d_T + 2|S||T|d_{S,T}}{|V|^2}.$$

W.l.o.g assume that $d_S \ge d_T$ therefore if $d_S \ge D_{S,T}$, $$d_V = \frac{|S|^2 d_S + |T|^2 d_T + 2|S||T|d_{S,T}}{|V|^2}$$

-continued $$\le \frac{|S|^2 d_S + |T|^2 d_S - |T|^2 d_S + |T|^2 d_T + 2|S||T|d_S}{|V|^2}$$

$$= \frac{d_S(|S|+|T|)^2 - |T|^2(d_S - d_T)}{|V|^2}$$

$$\le d_S.$$

If $d_{S,T} \ge \max\{d_S, d_T\}$ then, $$d_V = \frac{|S|^2 d_S + |T|^2 d_T + 2|S||T|d_{S,T}}{|V|^2}$$

$$\le \frac{|S|^2 d_{S,T} + |T|^2 d_{S,T} + 2|S||T|d_{S,T}}{|V|^2}$$

$$= d_{S,T}$$

and the result follows.

Now we are ready to prove the optimality of the duplication of the code using standard basis, if we assume that the number of copies s tends to infinity.

Theorem 14. For any induced subgraph H of $D_m$, $$d_H \le \frac{m-1}{m}.$$

So the optimal asymptotic ratio among all codes constructed using duplication and Construction 1 is $$\frac{1}{2}\left(1 + \frac{1}{m}\right)$$

and is achieved using the standard basis.

Proof: We say that a binary vector is an even (odd) vector if it has an even (odd) weight. For two binary vectors $w_1$, $w_2$, $|w_2 \backslash w_1|$ being odd is equivalent to $$1 = w_2 \cdot \overline{w_1} = w_2 \cdot ((1, \ldots, 1) + w_1) = \|w_2\|_1 + w_2 \cdot w_1.$$

Hence, one can check that when $w_1$, $w_2$ have the same parity, there are either no edges or two edges between them. Moreover, when their parities are different, there is exactly one edge between the two vertices.

When m=1, the graph $D_1$ has only one vertex and the only nonempty induced subgraph is itself. Thus, $$d_H = d_{D_1} = 0 = \frac{m-1}{m}.$$

When m=2, the graph $D_2$ has three vertices and one can check that the induced subgraph with maximum density contains $w_1=(1,0)$, $w_2=(0, 1)$, and the density is 1/2=(m−1)/m.

For m>2, assume to the contrary that there exists a subgraph of $D_m$ with density higher than $$\frac{m-1}{m}.$$

Let H be the smallest subgraph of $D_m$ (with respect to the number of vertices) among the subgraphs of $D_m$ with maximal density. Hence for any subset of vertices $S \subset V(H)$, we have $d_S < d_H$. Therefore from Lemma 13 we conclude that for any partition S, T of V(H), $d_H \le d_{S,T}$. If H contains both even and odd vectors, denote by S and T the set of even and odd vectors of H respectively. Since between any even and any odd vertex there is exactly one directed edge we get that $$d_H \le d_{S,T} = \frac{1}{2}.$$

However $$\frac{1}{2} < \frac{m-1}{m} < d_H,$$

and we get a contradiction. Thus H contains only odd vectors or even vectors.

Let $V(H)=\{v_1, \ldots, v_k\}$. If this set of vectors is independent then $k \le m$ and the outgoing degree for each vertex $v_i$ is at most $k-1$ hence $$d_H = \frac{E(H)}{|V(H)|^2} \le \frac{k(k-1)}{k^2} \le \frac{m-1}{m}$$

and we get a contradiction. Hence assume that the dimension of the subspace spanned by these vectors in $F_2^m$ is $l < k$ where $v_1, v_2, \ldots v_l$ are basis for it. Define $S=\{v_1, \ldots v_l\}$, $T=\{v_{l+1}, \ldots, v_k\}$. The following two cases show that the density cannot be higher than $$\frac{m-1}{m}.$$

H contains only odd vectors: Let $u \in T$. Since $u \in \text{span}\{S\}$ there is at least one $v \in S$ such that $u \cdot v \ne 0$ and thus $(u,v), (v,u) \notin E(H)$, therefore the number of directed edges between u and S is at most $2(l-1)$ for all $u \in T$, which means $$d_H \le d_{S,T} \le \frac{2(l-1)|T|}{2|S||T|} = \frac{l-1}{l} \le \frac{m-1}{m}$$

and we get a contradiction.

H contains only even vectors: Since the $v_i$'s are even the dimension of span$\{S\}$ is at most $m-1$ (since for example $(1, 0, \ldots, 0) \notin \text{span}\{S\}$) thus $l \le m-1$. Let H* be the induced subgraph of $D_{m+1}$ with vertices $V(H^*)=\{(1, v_i)|v_i \in V(H))\}$. It is easy to see that all the vectors of H* are odd, $((1, v_i), (1, v_j)) \in E(H^*)$ if and only if $(v_i, v_j) \in E(H)$, and the dimension of span$\{V(H^*)\}$ is at most $l+1 \le m$. Having already proven the case for odd vectors, we conclude that $$d_H = d_{H^*} \le \frac{\dim(\text{span}\{V(H^*)\}) - 1}{\dim(\text{span}\{V(H^*)\})}$$
$$\le \frac{l+1-1}{l+1}$$
$$\le \frac{m-1}{m},$$

and we get a contradiction.

V. Finite Field Size of A Code

In this section, we address the problem of finding proper coefficients in the parities in order to make the code an MDS. We have already shown that if a code is over some large enough finite field F, it can be made MDS (Theorem 3). In the following, we will discuss in more details on the field size required to make three kinds of codes MDS: (1) the optimal code in Theorem 8, (2) its duplication in Corollary 11, and (3) a modification of the code in Example 1. Note that both the codes in (2) and (3) have asymptotic optimal ratio.

Consider the (m+3, m+1) code C constructed by Theorem 8 and the vectors $\{e_i\}_{i=0}^m$. Let the information in row i, column j be $a_{i,j} \in F$. Let its row coefficient be $\alpha_{i,j}$ and zigzag coefficient be $\beta_{i,j}$. For a row set $R_u=\{a_{u,0}, a_{u,1}, \ldots, a_{u,m}\}$, the row parity is $r_u=\Sigma_{j=0}^m \alpha_{u,j} a_{u,j}$. For a zigzag set $z_u=\{a_{u,0}, a_{u+e_1,1}, \ldots, a_{u+e_m,m}\}$, the zigzag parity is $z_u=\Sigma_{j=0}^m \beta_{u+e_j,j} a_{u+e_j,j}$.

Recall that the (m+3, m+1) code is MDS if we can recover the information from up to two columns erasures. It is clear that none of the coefficients $\alpha_{i,j}, \beta_{i,j}$ can be zero. Moreover, if we assign all the coefficients as $\alpha_{i,j}=\beta_{i,j}=1$ we get that in an erasure of two systematic columns the set of equations derived from the parity columns are linearly dependent and thus not solvable (the sum of the equations from the row parity and the sum of those from the zigzag parity will be the same). Therefore the coefficients need to be from a field with more than 1 nonzero element, thus a field of size at least three is necessary. The construction below surprisingly shows that in fact $F_3$ is sufficient.

Construction 2. For the code C in Theorem 8 over $F_3$, define $u_j = \Sigma_{l=0}^j e_l$ for $0 \le j \le m$. Assign row coefficients as $\alpha_{i,j}=1$ for all i, j, and zigzag coefficients as $$\beta_{i,j}=2^{i \cdot u_j},$$

where $i=(i_1, \ldots, I_m)$ is represented in binary and the calculation in the exponent is done over $F_2$.

Theorem 15. Construction 2 is an (m+3, m+1) MDS code.

Proof: It is easy to see that if at least one of the two erased columns is a parity column then we can recover the information. Hence we only need to show that we can recover from any erasure of two systematic columns. In an erasure of two systematic columns i, $j \in [0, m]$, $i < j$, we access the entire remaining information in the array. For $r \in [0, 2^m - 1]$ set $r' = r + e_i + e_j$, and recall that $a_{r,i} \in Z_l$ iff $l = r + e_i$, thus $a_{r,i}, a_{r',j} \in Z_{r+ei}$ and $a_{r,j}, a_{r',i} \in Z_{r+ei}$. From the two parity columns we need to solve the following equations (for some $y_1, y_2, y_3, y_4 \in F_3$)

$$\begin{bmatrix} 1 & 1 & 0 & 0 \\ 0 & 0 & 1 & 1 \\ \beta_{r,i} & 0 & 0 & \beta_{r',j} \\ 0 & \beta_{r,j} & \beta_{r',i} & 0 \end{bmatrix} \begin{bmatrix} a_{r,i} \\ a_{r,j} \\ a_{r',i} \\ a_{r',j} \end{bmatrix} = \begin{bmatrix} y_1 \\ y_2 \\ y_3 \\ y_4 \end{bmatrix}$$

This set of equations is solvable iff $$\beta_{r,i}\beta_{r',i} \ne \beta_{r,j}\beta_{r',j}. \quad (12)$$

Note that the multiplicative group of $F_3 \setminus 0$ is isomorphic to the additive group of $F_2$, hence multiplying two elements in $F_3 \setminus 0$ is equivalent to summing up their exponent in $F_2$ when they are represented as a power of the primitive element of the field $F_3$. For columns $0 \le i < j \le m$ and rows r, r' defined above, we have $$\beta_{r,i}\beta_{r',i}=2^{r \cdot u_j + r' \cdot u_i}=2^{(r+r') \cdot u_i}=2^{(e_i+e_j) \cdot \Sigma_{l=0}^i e_l}=2^{e_i^2}=2.$$

However in the same manner we derive that $$\beta_{r,j}\beta_{r',j}=2^{(r+r')\cdot u_j}=2^{(e_i+e_j)\cdot \Sigma_{l=0}^{j}e_l}=2^{e_i^2+e_j^2}=2^0=1.$$

Hence (12) is satisfied and the code is MDS.

Remark: The above proof shows that $\beta_{r,i}\neq\beta_{r',i}$, and $\beta_{r,j}=\beta_{r',j}$ for $i<j$. And Equation (12) is a necessary and sufficient condition for a MDS code for vectors $v_i\neq v_j$. Moreover the coefficients in FIG. 3 are assigned by Construction 2.

Next we discuss the finite field size of the duplication of the optimal code (the code in Corollary 11). For the s-duplication code C' in Corollary 11, denote the coefficients for the element in row i and column $j^{(t)}$ by $\alpha_{i,j}^{(t)}$ and $\beta_{i,j}^{(t)}$, $0\leq t\leq s-1$. Let $F_q$ be a field of size q, and suppose its elements are $\{0, a^0, a^1, \ldots, a^{q-2}\}$ for some primitive element a.

Construction 3. For the s-duplication code C' in Corollary 11 over $F_q$, assign $\alpha_{i,j}^{(t)}=1$ for all i, j, t. For odd q, let $s\leq q-1$ and assign for all $t\in[0, s-1]$ $$\beta_{i,j}^{(t)} = \begin{cases} a^{t+1}, & \text{if } u_j \cdot i = 1 \\ a^t, & o.w. \end{cases}$$

where $u_j=\Sigma_{l=0}^{j}e_l$. For even q (powers of 2), let $s\leq q-2$ and assign for all $t\in[0, s-1]$ $$\beta_{i,j}^{(t)} = \begin{cases} a^{-t-1}, & \text{if } u_j \cdot i = 1 \\ a^{t+1}, & o.w. \end{cases}$$

Notice that the coefficients in each duplication has the same pattern as Construction 2 except that values 1 and 2 are replaced by $a^t$ and $a^{t+1}$ if q is odd (or $a^{t+1}$ and $a^{-t-1}$ if q is even).

Theorem 16. Construction 3 is an $(s(m+1)+2, s(m+1))$ MDS code.

Proof: For the two elements in columns $i^{(t1)}$, $i^{(t2)}$ and row r, $t_1\neq t_2$, we can see that they are in the same row set and the same zigzag set. The corresponding two equations from the two parities are linearly independent iff $$\beta_{r,i}^{(t1)}\neq\beta_{r,i}^{(t2)}, \quad (13)$$

which is satisfied by the construction.

For the four elements in columns $i^{(t1)}$, $j^{(t2)}$ and rows r, $r'=r+e_i+e_j$, $0\leq t_1, t_2\leq s-1$, $0\leq i<j\leq m$, the code is MDS if $$\beta_{r,i}^{(t1)}\beta_{r',i}^{(t1)}\neq\beta_{r,j}^{(t2)}\beta_{r',j}^{(t2)}$$

by Equation (12). By the remark after Theorem 15, we know that $\beta_{r,i}^{(t1)}\neq\beta_{r',i}^{(t1)}$, and $\beta_{r,j}^{(t2)}\neq\beta_{r',j}^{(t2)}=\alpha a^x$ for some x. When q is odd, $$\beta_{r,i}^{(t1)}\beta_{r',i}^{(t1)}=a^{t_1+1}a^{2t_1+1}\neq a^{2x}$$

for any x and $t_1$. When q is even, $$\beta_{r,i}^{(t1)}\beta_{r',i}^{(t1)}=a^{t_1+1}a^{-t_1-1}=a^0\neq a^{2x}$$

for any $t_1$ and $1\leq x\leq q-2$ (mod q-1). And by construction, $x=t_2+1$ or $x=-t_2-1$ for $0\leq t_2\leq s-1\leq q-3$, so $1\leq x\leq q-2$ (mod q-1). Hence, the construction is MDS.

Remark: For two identical permutations $f_i^{(t1)}=f_i^{(t2)}$, Equation (13) is necessary and sufficient condition for an MDS code.

Theorem 17. For an MDS s-duplication code, we need a finite field $F_q$ of size $q\geq s+1$. Therefore, Theorem 16 is optimal for odd q.

Proof: Consider the two information elements in row i and columns $j^{(t1)}$, $j^{(t2)}$, which are in the same row and zigzag sets, for $t_1\neq t_2\in[0, s-1]$. The code is MDS only if $$\begin{bmatrix} \alpha_{i,j}^{t1} & \alpha_{i,j}^{t2} \\ \beta_{i,j}^{t1} & \beta_{i,j}^{t2} \end{bmatrix}$$

has full rank. All the coefficients are nonzero (consider erasing a parity column and a systematic column). Thus, $(\alpha_{i,j}^{t_1})^{-1}\beta_{i,j}^{(t_1)}\neq(\alpha_{i,j}^{(t_2)})^{-1}\beta_{i,j}^{(t_2)}$, and $(\alpha_{i,j}^{(t)})^{-1}\beta_{i,j}^{(t)}$ are distinct nonzero elements in $F_q$, for $i\in[0, s-1]$. So $q\geq s+1$.

For instance, the coefficients in FIG. 4 are assigned as Construction 3 and $F_3$ is used. One can check that any two column erasures can be rebuilt in this code.

Consider for example an s-duplication of the code in Theorem 8 with m=10, the array is of size 1024×(11s+2). For s=2 and s=6, the ratio is 0.522 and 0.537 by Corollary 11, the code length is 24 and 68, and the field size needed can be 4 and 8 by Theorem 16, respectively. Both of these two sets of parameters are suitable for practical applications.

As noted before the optimal construction yields a ratio of $1/2+1/m$ by using duplication of the code in Theorem 8. However the field size is a linear function of the number of duplications of the code. Is it possible to extend the number of columns in the code while using a constant field size? We know how to get $O(m^3)$ columns by using $O(m^2)$ duplications of the optimal code, however, the field size is $O(m^2)$. The following code construction has roughly the same parameters: $O(m^3)$ columns and an ratio of $$\frac{1}{2}+O\left(\frac{1}{m}\right),$$

however it requires only a constant field size of 9. Actually this construction is a modification of Example 1.

Construction 4. Let 3|m, and consider the following set of vectors $S\subseteq F_2^m$: for each vector $v=(v_1,\ldots,v_m)\in S$, $\|v\|_1=3$ and $v_{i_1}, v_{i_2}, v_{i_3}=1$ for some $i_1\in[1, m/3]$, $i_2\in[m/3+1, 2m/3]$, $i_3\in[2m/3+1, m]$. For simplicity, we write $v=\{v_1, i_2, i_3\}$. Construct the (k+2, k) code as in Construction 1 using the set of vectors S, hence the number of systematic columns is $$k = |S| = \left(\frac{m}{3}\right)^3 = \frac{m^3}{27}.$$

For any $i\in[jm/3+1, (j+1)m/3]$ and some j=0, 1, 2, define a row vector $M_i=\Sigma_{l=jm/3+1}^{i}e_l$. Then define a m×3 matrix $$M_v=[M_{i_1}^T M_{i_2}^T M_{i_3}^T]$$

for $v=\{i_1, i_2, i_3\}$. Let a be a primitive element of $F_9$. Assign the row coefficients as 1 and the zigzag coefficient for row r, column v as $a^t$, where $t=rM_v\in F_2^3$ (in its binary expansion).

For example, let m=6, and $v=\{1, 4, 6\}=(1,0,0,1,0,1)\in S$. The corresponding matrix is $$M_v = \begin{bmatrix} 1 & 0 & 0 & 0 & 0 & 0 \\ 0 & 0 & 1 & 1 & 0 & 0 \\ 0 & 0 & 0 & 0 & 1 & 1 \end{bmatrix}^T.$$

For row r=26=(0,1,1,0,1,0), we have $$t=rM_v=(0,1,1)=3,$$

and the zigzag coefficient is $a^3$.

Theorem 18. Construction 4 is a (k+2, k) MDS code with array size $2^m \times (k+2)$ and $k=m^3/27$. Moreover, the rebuilding ratio is $$\frac{1}{2} + \frac{9}{2m}$$

for large m.

Proof: For each vector $v \in S$, there are $3(m/3-1)^2$ vectors $u \in S$ such that they have one "1" in the same location as v, i.e. $|v \backslash u|=2$. Hence by Theorem 6 and Lemma 7, for large m the ratio is $$\frac{1}{2} + \frac{3\left(\left(\frac{m}{3}\right)-1\right)^2}{2\left(\frac{m^3}{27}+1\right)} \approx \frac{1}{2} + \frac{9}{2m}.$$

Next we show that the MDS property of the code holds. Consider columns u, v for some $u=\{i_1, i_2, i_3\} \neq v=\{j_1, j_2, j_3\}$ and $i_1, j_1 \in [1, m/3]$, $i_2, j_2 \in [m/3+1, 2m/3]$, $i_3, j_3 \in [2m/3+1, m]$. Consider rows r and r'=r+u+v. The condition for the MDS property from Equation (12) becomes $$a^{rM_u^T + r'M_u^T \bmod 8} \neq a^{rM_v^T + r'M_v^T \bmod 8} \tag{14}$$

where each vector of length 3 is viewed as an integer in [0,7] and the addition is usual addition mod 8. Since $v \neq u$, let $l \in [1,3]$ be the largest index such that $i_l \neq j_l$. W.l.o.g. assume that $i_l < j_l$, hence by the remark after Theorem 15

$$rM_{i_l}^T \neq r'M_{i_l}^T \tag{15}$$

and $$rM_{j_l}^T \neq r'M_{j_l}^T. \tag{16}$$

Note that for all t, $1 \leq t \leq 3$, $i_t = j_t$, then since $r'M_{i_t}^T = (r + e_{i_t} + e_{j_t})M_{i_t}^T = rM_{i_t}^T$, we have $$rM_{i_t}^T = r'M_{i_t}^T = rM_{j_t}^T = r'M_{j_t}^T. \tag{17}$$

It is easy to infer from Equations (15), (16), and (17) that the l-th bit in the binary expansions of $rM_u^T + r'M_u^T \bmod 8$ and $rM_v^T + r'M_v^T \bmod 8$ are not equal. Hence Equation (14) is satisfied, and the result follows.

Notice that if we do mod 15 in Equation (14) instead of mod 8, the proof still follows because 15 is greater than the largest possible sum in the equation. Therefore, a field of size 16 is also sufficient to construct an MDS code, and it is easier to implement in a storage system.

Construction 4 can be easily generalized to any constant c such that it contains $O(m^c)$ columns and it uses the field of size at least $2^c+1$. For simplicity assume that c|m, and simply construct the code using the set of vectors $\{v\} \subset F_2^m$ such that $\|v\|_1 = c$, and for any $j \in [0, c-1]$, there is unique $i_j \in [jm/c+1, (j+1)m/c]$ and $v_{i_j}=1$. Moreover, the finite field of size $2^{c+1}$ is also sufficient to make it an MDS code. When c is odd the code has ratio of $$\frac{1}{2} + \frac{c^2}{2m}$$

for large m.

VI. Decoding of The Codes

In this section, we will discuss decoding algorithms of the proposed codes in case of column erasures as well as a column error. The algorithms work for both Construction 1 and its duplication code.

Let C be a (k+2, k) MDS array code defined by Construction 1 (and possibly duplication). The code has array size $2^m \times (k+2)$. Let the zigzag permutations be $f_j$, $j \in [0, k-1]$ which are not necessarily distinct. Let the information elements be $a_{i,j}$, and the row and zigzag parity elements be $r_i$ and $z_i$, respectively, for $i \in [0, 2^m-1]$, $j \in [0, k-1]$. W.l.o.g. assume the row coefficients are $a_{i,j}=1$ for all i, j. And let the zigzag coefficients be $\beta_{i,j}$ in some finite field F.

The following is a summary of the erasure decoding algorithms mentioned in the previous sections.

A. Algorithm 1 (Erasure Decoding)

One erasure.

(1) One parity node is erased. Rebuild the row parity by $$r_i = \sum_{j=0}^{k-1} a_{i,j}, \tag{18}$$

and rebuild the zigzag parity by $$z_i = \sum_{j=0}^{k-1} \beta_{f_j^{-1}(i),j} a_{f_j^{-1}(i),j}. \tag{19}$$

(2) One information node j is erased. Rebuild the elements in rows $X_j$ (see Construction (1) by rows), and those in rows $\overline{X_j}$ by zigzags.

Two erasures.

(1) Two parity nodes are erased. Rebuild by Equations (18) and (19) above.

(2) One parity node and one information node is erased. If the row parity node is erased, rebuild by zigzags; otherwise rebuild by rows.

(3) Two information nodes $j_1$ and $j_2$ are erased.

If $f_{j_1} = f_{j_2}$, for any $i \in [0, 2^m-1]$, compute $$x_i = r_i - \sum_{j \neq j_1, j_2} a_{i,j} \tag{20}$$

$$y_i = z_{f_{j_1}(i)} - \sum_{j \neq j_1, j_2} \beta_{f_j^{-1} f_{j_1}(i),j} a_{f_j^{-1} f_{j_1}(i),j}$$

Solve $\alpha_{i,j_1}$, $\alpha_{i,j_2}$ from the equations $$\begin{bmatrix} 1 & 1 \\ \beta_{i,j_1} & \beta_{i,j_2} \end{bmatrix} \begin{bmatrix} a_{i,j_1} \\ a_{i,j_2} \end{bmatrix} = \begin{bmatrix} x_i \\ y_i \end{bmatrix}$$

Else, for any $i \in [0, 2^m-1]$, set $i'=i+f_{j_1}(0)+f_{j_2}(0)$, and compute $x_i, x_{i'}, y_i, y_{i'}$ according to Equation (20). Then solve $a_{i,j_1}, a_{i,j_2}, a_{i',j_1}, a_{i',j_2}$ from equations $$\begin{bmatrix} 1 & 1 & 0 & 0 \\ 0 & 0 & 1 & 1 \\ \beta_{i,j_1} & 0 & 0 & \beta_{i',j_2} \\ 0 & \beta_{i,j_2} & \beta_{i',j_1} & 0 \end{bmatrix} \begin{bmatrix} a_{i,j_1} \\ a_{i,j_2} \\ a_{i',j_1} \\ a_{i',j_2} \end{bmatrix} = \begin{bmatrix} x_i \\ x_{i'} \\ y_i \\ y_{i'} \end{bmatrix}.$$

In case of a column error, we first compute the syndrome, then locate the error position, and at last correct the error. Let $x_0, x_1, \ldots, x_{p-1} \in F$. Denote $f^{-1}(x_0, x_1, \ldots, x_{p-1}) = (x_{f^{-1}(0)}, \ldots, x_{f^{-1}(p-1)})$ for a permutation f on $[0, p-1]$. The detailed algorithm is as follows.

B. Algorithm 2 (Error Decoding)

Compute for all $i \in [0, 2^m - 1]$:

$$s_{i,0} = \sum_{j=0}^{k-1} a_{i,j} - r_i$$

$$s_{i,1} = \sum_{j=0}^{k-1} \beta_{f_j^{-1}(i),j} a_{f_j^{-1}(i),j} - z_i$$

Let the syndrome be $S_0 = (s_{0,0}, s_{1,0}, \ldots, s_{2^m-1,0})$ and $S_1 = (s_{0,1}, s_{1,1}, \ldots, s_{2^m-1,1})$.

If $S_0 = 0$ and $S_1 = 0$, there is no error.

Else if one of $S_0$, $S_1$ is 0, there is an error in the parity.
  Correct it by Equation (18) or Equation (19).

Else, find the error location. For j=0 to k−1:
  Compute for all $i \in [0, 2^m-1]$, $x_{i,j} = \beta_{i,j} s_{i,0}$.
  Let $X_j = (x_{0,j}, \ldots, x_{2^m-1,j})$ and $Y_j = f_j^{-1}(X_j)$.
  If $Y_j = S_1$, subtract $S_0$ from column j. Stop.
  If no such j is found, there is more than one error.

If there is only one error, the above algorithm is guaranteed to find the error location and correct it, since the code is MDS, as the following theorem states.

Theorem 19. Algorithm 2 can correct one column error.

Proof: Notice that each zigzag permutation $f_j$ is the inverse of itself by Construction 1, or $f_j = f_j^{-1}$. Suppose there is error in column j, and the error is $E = (e_0, e_1, \ldots, e_{2^m-1})$. So the received column j is the sum of the original information and E. Thus the syndromes are $s_{i,0} = e_i$ and $$s_{i,1} = \beta_{f_j(i),j} e_{f_j(i)}.$$

For column t, $t \in [0, k-1]$, we have $x_{i,t} = \beta_{i,t} s_{i,0} = \beta_{i,t} e_i$. Write $Y_t = (y_{0,t}, \ldots, y_{2^m-1,t})$ and then $$y_{i,t} = x_{f_t(i),t} = \beta_{f_t(i),t} e_{f_t(i)}.$$

We will show the algorithm finds $Y_t = S_1$ iff t=j, and therefore subtracting $S_0 = E$ from column j will correct the error. When t=j, $y_{i,t} = s_{i,1}$ for all $i \in [0, 2^m-1]$, so $Y_j = S_1$. Now suppose there is $t \neq j$ such that $Y_t = S_1$. Since the error E is nonzero, there exists i such that $e_{f_j(i)} \neq 0$. Consider the indices i and $i' = f_t f_j(i)$. $y_{i,t} = s_{i,1}$ yields $$\beta_{f_t(i),t} e_{f_t(i)} = \beta_{f_j(i),j} e_{f_j(i)}. \tag{21}$$

Case 1: When $f_t = f_j$, set $r = f_t(i) = f_j(i)$, then Equation (21) becomes $\beta_{r,t} e_r = \beta_{r,j} e_r$ with $e_r \neq 0$. Hence $\beta_{r,t} = \beta_{r,j}$ which contradicts Equation (13).

Case 2: When $f_t \neq f_j$, since $f_t, f_j$ are commutative and are inverse of themselves, $f_t(i') = f_t f_t f_j(i) = f_j(i)$ and $f_j(i') = f_j f_t f_j(i) = f_t(i)$. Therefore $y_{i',t} = s_{i',1}$ yields $$\beta_{f_j(i),t} e_{f_j(i)} = \beta_{f_t(i),j} e_{f_t(i)}.$$

The above two equations have nonzero solution $(e_{f_j(i)}, e_{f_t(i)})$ iff $$\beta_{f_t(i),t} \beta_{f_t(i),j} = \beta_{f_j(i),j} \beta_{f_j(i),t}$$

which contradicts Equation (12) with $r = f_t(i)$, $r' = f_j(i)$. Hence the algorithm finds the unique erroneous column.

If the computations are done in parallel for all $i \in [0, 2^m-1]$, then Algorithm 2 can be done in time O(k). Moreover, since the permutations $f_i$'s only change one bit of a number in $[0, 2^m-1]$ in the optimal code in Theorem 8, the algorithm can be easily implemented.

C. Correcting Node Erasures and Element Errors in Zigzag Code

In array codes for storage systems, data is arranged in a 2D array. Each column in the array is typically stored in a separate disk and is called a node, and each entry in the array is called an element. In the conventional error model, disk failures correspond to an erasure or an error of an entire node. Therefore, array codes are usually designed to correct such entire node failures. However, if we consider different applications, such as the case of flash memory as storage nodes, element error is also possible. In other words, we may encounter only a few errors in a column as well as entire node erasures. For an MDS array code with two parities, the minimum Hamming distance is 3, therefore, it is not possible to correct a node erasure and a node error at the same time. However, since a Zigzag code has very long column lengths, we ask ourselves: is it capable of correcting a node erasure and some element errors?

Given a (k+2, k) Zigzag code generated by distinct binary vectors $T = \{v_0, v_1, \ldots, v_{k-1}\}$, the following algorithm called Z1 (designated with "Z" because it particularly applies to Zigzag codes) corrects a node erasure and an element error. Here we assume that the erasure and error are in different columns, and there is only a single element error in the systematic part of the array. The code has two parities and $2^m$ rows, and the zigzag permutations are $f_j = v_j$, $j \in [0, k-1]$. The original array is denoted by $(a_{i,j})$, the erroneous array is $(\hat{a}_{i,j})$. The row coefficients are all ones, and the zigzag coefficients are i, j. Let $x_0, x_1, \ldots, x_{p-1} \in F$. Denote $f^{-1}(x_0, x_1, \ldots, x_{p-1}) = (x_{f^{-1}(0)}, x_{f^{-1}(1)}, \ldots, x_{f^{-1}(p-1)})$ for a permutation f on $[0, p-1]$.

Algorithm Z1. Suppose column t is erased, and there is at most one element error in the remaining array. Compute for all $i \in [0, 2m-1]$ the syndromes:

$$s_{i,0} = \sum_{j \neq t} \hat{a}_{i,j} \, r_i,$$

$$s_{i,1} = \sum_{j \neq t} \beta_{f_j^{-1}(i),j} \hat{a}_{f_j^{-1}(i),j} - z_i.$$

Let the syndrome be $S_0 = (s_{0,0}, s_{1,0}, \ldots, s_{2^m-1,0})$ and $S_1 \times (s_{0,1}, s_{1,1}, \ldots, s_{2^m-1,1})$.

Compute for all $i \in [0, 2^m-1]$, $x_i = \beta_{i,t} s_{i,0}$. Let $X = (x_0, \ldots, x_{2^m-1})$, $Y = f_t^{-1}(S_1)$, W X=Y.

If W=0, there is no element error. Assign column t as $-S_0$.

Else, there will be two rows r, r' such that $w_r$, $w_{r'}$ are nonzero. Find j such that $v_j = r + r' + v_t$. The error is in column j.

If $$\frac{w_r}{w_{r'}} = \frac{\beta_{r,t}}{\beta_{r,j}},$$

then the error is at row r, and assign $$a_{r,j} = \hat{a}_{r,j} \frac{w_r}{\beta_{r,t}}.$$

Else if $$\frac{w_r}{w_{r'}} = \frac{\beta_{r',j}}{\beta_{r',t}},$$

then the error is at row r', and assign $$a_{r',j} = \hat{a}_{r',j} \frac{w_{r'}}{\beta_{r',t}}.$$

Else there is more than one error.

Theorem Z2. The above algorithm can correct a node erasure and a systematic element error.

Proof Suppose column t is erased and there is an error at column j and row r. Define $r'=r+v_t+v_j$. Let $\hat{a}_{r,j}=a_{r,j}+e$. It is easy to see that $x_i=y_i=-\beta_{i,t}\alpha_{i,t}$ except when $i=r,r'$. Since the set of binary vectors $\{v_0, v_1, \ldots, v_{k-1}\}$ are distinct, we know that the error is in column j. Moreover, we have $x_r = +\beta_{r,t}\alpha_{r,t}\beta_{r,j}e,$ $y_r = -\beta_{r,t}\alpha_{r,t},$ $x_{r'} = -\beta_{r',t}\alpha_{r',t},$ $y_{r'} = +\beta_{r',t}\beta_{r,j}e.$ Therefore, the difference between X and Y is $w_r = x_r - y_r = \beta_{r,t}e,$ $w_{r'} = x_{r'} - y_{r'} = \beta_{r,j}e.$ And we can see that no matter what e is, we always have $$\frac{w_r}{w_{r'}} = \frac{\beta_{r,t}}{\beta_{r',j}}.$$

Similarly, if the error is at row r', we will get $$\frac{w_r}{w_{r'}} = \frac{\beta_{r',j}}{\beta_{r',t}}.$$

By the MDS property of the code, we know that $\beta_{r,t}\beta_{r',t} \neq \beta_{r,j}\beta_{r',j}$ (see the remark after the proof of the finite field size 3). Therefore, we can distinguish between the two cases of an error in row r and in row r'.

Example Z3

Consider the code in FIG. 1. Suppose all of Column 0 is erased. And suppose there is an error in the 0-th element in Column 1. Namely, the erroneous symbol we read is $\hat{b}_0 = b_0$ e-for some error $e \neq 0 \in \Phi_3$, see FIG. 2. We can simply compute the syndrome, locate this error, and recover the original array. Since the erased column corresponds to the zero vector, and all the coefficients in column 0 are ones. The algorithm is simplified. For $i \in [0, 3]$, we compute the syndromes and subtract them, we get zeros in all places except row 0 and 2, which satisfy $0+2=(0,0)+(1,0)=(1,0)=e_1$. Therefore, we know the location of the error is in column 1 and row 0 or 2. But since $W_0 = -W_2$, we know the error is in $\hat{b}_0$ (If $W_0 = W_2$, the error is in $\hat{b}_2$).

In practice, when we are confident that there are no element errors besides the node erasure, we can use the optimal rebuilding algorithm and access only half of the array to rebuild the failed node. However, we can also try to rebuild this node by accessing the other half of the array. Thus we will have two recovered version for the same node. If they are equal to each other, there are no element errors; if not, there are element errors. Thus, we have the flexibility of achieving optimal rebuilding ratio or correcting extra errors.

When there is one node erasure and more than one element errors in column j and row $R=\{r_1, r_2, \ldots, r_l\}$, following the same techniques, it is easy to see that the code is able to correct systematic errors if $R \cup (R+v_j) \neq R' \cup (R'+v_i)$ for any set of rows R' and any other column index i, and $r_t \neq r_t + v_j$ for any $i, t \in [l]$.

When the code has more than two parities, the Zigzag code can again correct element errors exceeding the bound by the Hamming distance. To detect errors, one can either compute the syndromes, or rebuild the erasures multiple times by accessing different e/r parts of the array.

Finally, it should be noted that if a node erasure and a single error happen in a parity column, then we cannot correct this error in the (k+2, k) code.

VII. Generalization of The Code Construction

In this section we generalize Construction 1 into arbitrary number of parity nodes. Let $n-k=r$ be the number of parity nodes. We will construct an (n,k) MDS array code, i.e., it can recover from up to r node erasures for arbitrary integers n, k. We will show this code has optimal rebuilding ratio of 1/r when a systematic node is erased. We assume that each systematic nodes stores M/k of the information and corresponds to columns [0,k-1]. The i-th parity node is stored in column k+i, $0 \leq i \leq r-1$, and is associated with zigzag sets $\{Z_j^i : j \in [0, p-1]\}$ where p is the number of rows in the array.

Construction 5. Let the information array be $A=(a_{i,j})$ with size $r^m \times k$ for some integers k, m. Let $T=\{v_0, \ldots, v_{k-1}\} \subseteq Z_r^m$ be a subset of vectors of size k, where for each $v=(v_1, \ldots, v_m) \in T$, $$\gcd(v_1, \ldots, v_m, r). \tag{22}$$

where gcd is the greatest common divisor. For any l, $0 \leq l \leq r-1$, and $v \in T$ we define the permutation $f_v^l : [0, r^m-1] \to [0, r^m-1]$ by $f_v^l(x) = x + lv$, where by notation we use $x \in [0, r^m-1]$ both to represent the integer and its r-ary representation, and all the calculations are done over $Z_r$. For example, for m=2, r=3, x=4, l=2, v=(0, 1), $f_{(0,1)}^2(4) = 4+2(0,1) = (1,1)+(0,2) = (1,0) = 3,$ One can check that the permutation $f_v^l$ in a vector notation is [2,0,1,5,3,4,8,6,7]. For simplicity denote the permutation $f_{v_j}^l$ as $f_j^l$ for $v_j \in T$. For $t \in [0, r^m-1]$, we define the zigzag set $Z_t^l$ in parity node l as the elements $a_{i,j}$ such that their coordinates satisfy $f_j^l(i) = t$. In a rebuilding of systematic node i the elements in rows $X_i^l = \{x \in [0, r^m-1] : x \cdot v_i = r-1\}$ are rebuilt by parity node l, for $l \in [0, r-1]$. From Equation (22) we get that for any i and l, $|X_i^l| = r^{m-1}$.

Note that similar to Theorem 3, using a large enough field, the parity nodes described above form an (n,k) MDS array code under appropriate selection of coefficients in the linear combinations of the zigzags.

Consider the rebuilding of systematic node $i \in [0, k-1]$. In a systematic column $j \neq i$ we need to access all the elements that are contained in the sets that belong to the rebuilding set of column i. Namely, in column j we need to access the elements in rows $$\bigcup_{l=0}^{r-1} f_j^{-l} f_i^l(X_i^l). \tag{23}$$

Equation (23) follows since the zigzags $Z_t^l$ for any $t \in f_i^l(X_i^l)$ are used to rebuild the elements of column i in rows $X_i^l$. Moreover the element in column j and zigzag $Z_t^l$ is $a_{f_t^{-l}(t), j}$. The following lemma will help us to calculate the size of Equation (23), and in particular calculating the ratio of codes constructed by Construction 5.

Lemma 20. For any $v = (v_1, \ldots, v_m)$, $u \in Z_r^m$, and $l \in [0, r-1]$ such that $\gcd(v_1, \ldots, v_m, r) = 1$, define $c_{v,u} = v \cdot (v-u) - 1$. Then $$|f_u^{-i} f_v^i(X_v^i) \cap f_u^{-j} f_v^j(X_v^j)| = \begin{cases} |X_v^0|, & (i-j)c_{v,u} = 0 \\ 0, & o.w. \end{cases}$$

In particular for $j = 0$ we get $$|f_u^{-i} f_v^i(X_v^l) \cap X_v^0| = \begin{cases} |X_v^0|, & \text{if } l c_{v,u} = 0 \\ 0, & o.w. \end{cases}$$

Proof: Consider the group $(Z_r^m, +)$. Note that $X_v^0 = \{x : x \cdot v = 0\}$ is a subgroup of $Z_r^m$ and $X_v^i = \{x : x \cdot v = r - i\}$ is its coset. Therefore, $X_v^i = X_v^0 + a_v^i$, $X_v^j = X_v^0 + a_v^j$, for some $a_v^i \in X_v^i$, $a_v^j \in X_v^j$. Hence $f_u^{-i} f_v^i(X_v^i) = X_v^0 + a_v^i + i(v-u)$ and $f_u^{-j} f_v^j(X_v^j) = X_v^0 + a_v^j + j(v-u)$ are cosets of $X_v^0$. So they are either identical or disjoint. Moreover they are identical if and only if $$a_v^i - a_v^j + (i-j)(v-u) \in X_v^0,$$

i.e., $(a_v^i - a_v^j + (i-j)(v-u)) \cdot v = 0$. But by definition of $X_v^i$ and $X_v^j$, $a_v^i \cdot v = -i$, $a_v^j \cdot v = -j$, so $(i-j) \cdot c_{v,u} = 0$ and the result follows.

The following theorem gives the ratio for any code of Construction 5.

Theorem 21. The ratio for the code constructed by Construction 5 and set of vectors T is $$\frac{\sum_{v \in T} \sum_{u \neq v \in T} \frac{1}{\gcd(r, c_{v,u})} + |T|}{|T|(|T| - 1 + r)},$$

Which also equal to $$\frac{1}{r} + \frac{\sum_{v \in T} \sum_{u \in T, u \neq v} |F_{u,v}(\overline{X_v^0}) \cap \overline{X_v^0}|}{|T|(|T| - 1 + r) r^m}.$$

Here we define the function $F_{u,v}(t) = f_u^{-i} f_v^i(t)$ for $t \in X_v^i$.

Proof: By (23) and noticing that we access $r^{m-1}$ elements in each parity node, the ratio is $$\frac{\sum_{v \in T} \sum_{u \neq v \in T} |\bigcup_{i=0}^{r-1} f_u^{-i} f_v^i(X_v^i) \times| + |T| r^m}{|T|(|T| - 1 + r) r^m}. \tag{24}$$

From Lemma 20, and noticing that $|\{i : i c_{v,u} = 0 \mod r\}| = \gcd(r, c^{v,u})$, we get $$|\bigcup_{i=0}^{r-1} f_u^{-i} f_v^i(X_v^i)| = r^{m-1} \times r / \gcd(r, c_{v,u}).$$

And the first part follows. For the second part, $$\frac{\sum_{v \in T} \sum_{u \neq v \in T} |\bigcup_{i=0}^{r-1} f_u^{-i} f_v^i(X_v^i)| + |T| r^m}{|T|(|T| - 1 + r) r^m} = \frac{\sum_{v \in T} \sum_{u \neq v \in T} |X_v^0| + |\bigcup_{i=0}^{r-1} f_u^{-i} f_v^i(X_v^i) \setminus X_v^0| + |T| r^m}{|T|(|T| - 1 + r) r^m} \tag{25}$$

$$= \frac{1}{r} + \frac{\sum_{v \in T} \sum_{u \neq v \in T} |\bigcup_{i=0}^{r-1} f_u^{-i} f_v^i(X_v^i) \cap \overline{X_v^0}|}{|T|(|T| - 1 + r) r^m}$$

$$= \frac{1}{r} + \frac{\sum_{v \in T} \sum_{u \in T, u \neq v} |F_{u,v}(\overline{X_v^0}) \cap \overline{X_v^0}|}{|T|(|T| - 1 + r) r^m}.$$

The proof is completed.

Notice that $\overline{X_v^0}$ represents elements not accessed for parity 0 (row parity), and $F_{u,v}(\overline{X_v^0})$ are elements accessed for parity 1, 2, ..., r-1. Therefore $F_{u,v}(\overline{X_v^0}) \cap \overline{X_v^0}$ are the elements accessed excluding those for the row parity. In order to get a low rebuilding ratio, we need to minimize the second term in (25). We say that a family of permutation set $\{\{f_0^l\}_{l=0}^{r-1}, \ldots, \{f_{k-1}^l\}_{l=0}^{r-1}\}$ together with sets $\{\{X_0^l\}_{l=0}^{r-1}, \ldots, \{X_{k-1}^l\}_{l=0}^{r-1}\}$ is a family of orthogonal permutations if for any $i, j \in [0, k-1]$ the set $\{X_i^l\}_{l=0}^{r-1}$ is an equally-sized partition of $[0, r^{m-1}]$ and $$\frac{|F_{j,i}(\overline{X_i^0}) \cap \overline{X_i^0}|}{r^{m-1}(r-1)} = \delta_{i,j}.$$

One can check that for $r = 2$ the definition coincides with the previous definition of orthogonal permutations. It can be shown that the above definition is equivalent to that for any $0 \leq i \neq j \leq k-1$, $0 \leq l \leq r-1$, $$f_j^l(X_i^0) = f_i^l(X_i^0). \tag{26}$$

Theorem 22. The set $\{\{f_0^l\}_{l=0}^{r-1}, \ldots, \{f_m^l\}_{l=0}^{r-1}\}$ together with set $\{\{X_0^l\}_{l=0}^{r-1}, \ldots, \{X_m^l\}_{l=0}^{r-1}\}$ constructed by the vectors $\{e_i\}_{i=0}^m$ and Construction 5, where $X_0^l$ is modified to be $X_0^l = \{x \in Z_r^m : x \cdot (1, 1, \ldots, 1)\}$ for any $l \in [0, r-1]$ is a family of orthogonal permutations. Moreover the corresponding (m+1+r, m+1) code has optimal ratio of 1/r.

Proof: For $1 \leq i \neq j \leq m$, $c_{i,j} = e_i \cdot (e_i - e_j) - 1 = 0$, hence by Lemma 20 for any $l \in [0, r-1]$ $$f_j^{-l} f_i^l(X_i^l) \cap X_i^0 = X_i^0,$$

and Equation (26) is satisfied. For $1 \le i \le m$, and all $0 \le l \le r-1$, $$f_0^{-l}f_i^l(X_i^l) = f_i^{-l}(\{v : v_i = -l\})$$
$$= \{v + le_i : v_i = -l\}$$
$$= \{v : v_i = 0\} = X_i^0$$

Therefore, $f_0^{-l}f_i^l(X_i^l) \cap X_0^0 = X_i^0$, and Equation (26) is satisfied. Similarly, $$f_i^{-l}f_0^l(X_0^l) = f_i^{-l}(\{v : v \cdot (1, \ldots, 1) = l\})$$
$$= \{v - le_i : v \cdot (1, \ldots, 1) = l\}$$
$$= \{v : v \cdot (1, \ldots, 1) = 0\} = X_0^0.$$

Hence again (26) is satisfied and this is a family of orthogonal permutations. By (25) we get that the ratio is $1/r$, which is optimal according to Equation (1), and the result follows.

Surprisingly, one can infer from the above theorem that changing the number of parities from 2 to 3 adds only one node to the system, but reduces the ratio from 1/2 to 1/3 in the rebuilding of any systematic column.

Figure 7:
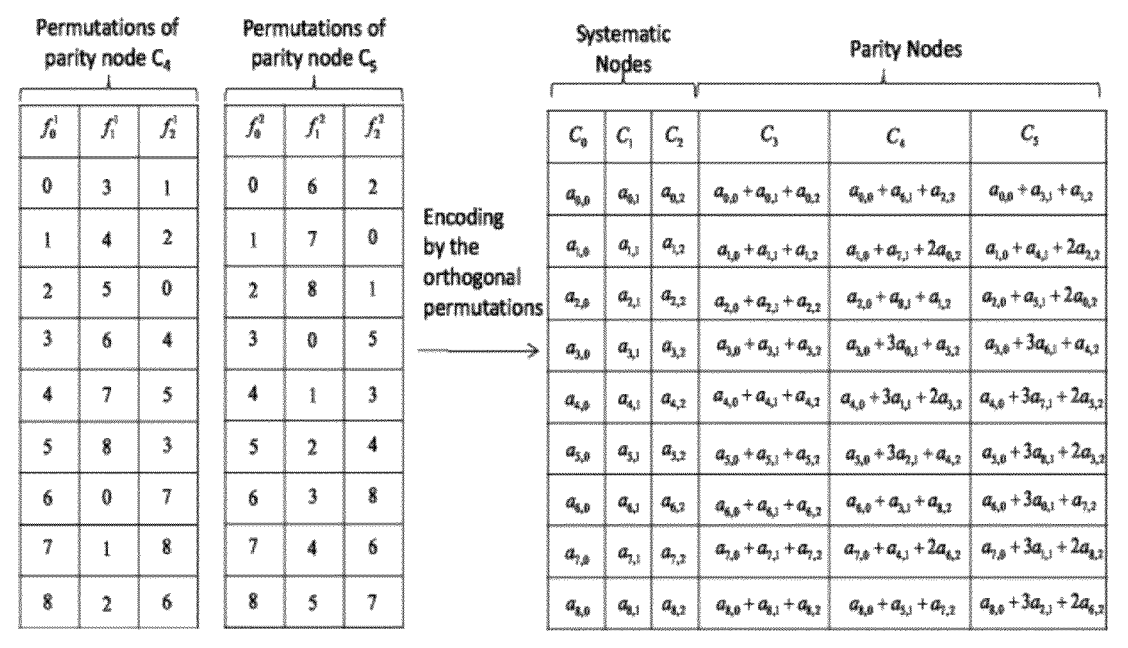

The example in FIG. 7 shows a code with three systematic nodes and three parity nodes constructed by Theorem 22 with $m=2$. The code has an optimal ratio of 1/3. For instance, if column $C_1$ is erased, then accessing rows $\{0, 1, 2\}$ in the remaining nodes will be sufficient for rebuilding. In FIG. 7, the first parity column $C_3$ corresponds to the row sums, and the corresponding identity permutations are omitted. The second and third parity columns $C_4$, $C_5$ are generated by the permutations $f_i^1$, $f_i^2$ respectively, for $i=0, 1, 2$. The elements are from $F_7$, where 3 is a primitive element.

Similar to the two-parity case, the following theorem shows that Theorem 22 achieves the optimal number of columns. In other words, the number of rows has to be exponential in the number of columns in any systematic MDS code with optimal ratio, optimal update, and r parities. This follows since any such optimal code is constructed from a family of orthogonal permutations.

Theorem 23. Let $\{\{f_0^l\}_{l=0}^{r-1}, \ldots, \{f_{k-1}^l\}_{l=0}^{r-1}\}$ be a family of orthogonal permutations over the integers $[0, r^m-1]$ together with the sets $\{\{X_0^l\}_{l=0}^{r-1}, \ldots, \{X_{k-1}^l\}_{l=0}^{r-1}\}$, then $k \le m+1$.

Proof: We prove it by induction on m. When $m=0$, it is trivial that $k \le 1$. Recall that orthogonality is equivalent to that any $0 \le i \ne j \le k-1$, $0 \le l \le r-1$, $$f_j^l(X_i^0) = f_i^l(X_i^l). \tag{27}$$

Notice that for any permutations $g, h_0, \ldots, h_{r-1}$, $\{\{h_l f_0^l g\}_{l=0}^{r-1}, \ldots, \{h_l f_{k-1}^l g\}_{l=0}^{r-1}\}$ are still a family of orthogonal permutations with sets $\{\{g^{-1}(X_0^l)\}, \ldots, \{g^{-1}(X_{k-1}^l)\}\}$. This is because $$h_l f_j^l g(g^{-1}(X_i^0)) = h_l f_j^l(X_i^0)$$
$$= h_l f_i^l(X_i^l)$$
$$= h_l f_i^l g(g^{-1}(X_i^l)).$$

Therefore, w.l.o.g. we can assume $X_0^l = [lr^{m-1}, (l+1)r^{m-1}-1]$, and $f_0^l$ is the identity permutation, for $0 \le l \le r-1$.

Let $1 \le i \ne j \le k-1$, $l \in [0, r-1]$ and define $A = f_j^l(X_i^0) = f_i^l(X_i^l),$ $B = f_j^l(X_i^0 \cap X_0^0),$ $C = f_i^l(X_i^l \cap X_0^0).$ Therefore B, C are subsets of A, and their compliments in A are $A \backslash B = f_j^l(X_i^0 \cap \overline{X_0^0}),$ $A \backslash C = f_i^l(X_i^l \cap \overline{X_0^0}).$ From Equation (27) for any $j \ne 0$, $$f_j^l(X_0^0) = f_0^l(X_0^l) = X_0^l \tag{28}$$

hence, $$B, C \subseteq X_0^l \tag{29}$$

Similarly, for any $j \ne 0$, $f_j^l(\overline{X_0^0}) = \overline{f_j^l(X_0^0)} = \overline{X_0^l}$, hence $$A \backslash B, A \backslash C \subseteq \overline{X_0^l}. \tag{30}$$

From Equations (29), (30) we conclude that $B = C = A \cap X_0^l$, i.e., $$f_j^l(X_i^0 \cap X_0^0) = f_i^l(X_i^l \cap X_0^0). \tag{31}$$

For each $l \in [0, r-1]$, $j \in [1, k-1]$ define $\hat{f}_j^l(x) = f_j^l(x) - lr^{m-1}$ and $\hat{X}_j^l = X_j^l \cap X_0^0$ then, $$\hat{f}_j^l([0, r^{m-1}-1]) = f_j^l(X_0^0) - lr^{m-1} \tag{32}$$
$$= X_0^l - lr^{m-1}$$
$$= [0, r^{m-1} - 1],$$

where Equation (32) follows from Equation (28). Moreover, since $f_i^l$ is bijective we conclude that $\hat{f}_i^l$ is a permutation on $[0, r^{m-1}-1]$.

$$\hat{f}_i^l(\hat{X}_i^l) = f_i^l(X_i^l \cap X_0^0) - lr^{m-1} \tag{33}$$
$$= f_j^l(X_i^0 \cap X_0^0) - lr^{m-1}$$
$$= \hat{f}_j^l(\hat{X}_i^0),$$

where Equation (33) follows from Equation (31). Since $\{X_i^l\}_{l=0}^{r-1}$ is a partition of $[0, r^m-1]$, then $\{\hat{X}_i^l\}_{l=0}^{r-1}$ is also a partition of $X_0^0 = [0, r^{m-1}-1]$. Moreover, since $\hat{f}_i^l(\hat{X}_i^l) = \hat{f}_j^l(\hat{X}_i^0)$ for any $l \in [0, r-1]$, and $\hat{f}_i^l$ is a bijection, we conclude $|\hat{X}_i^l| = |\hat{X}_i^0|$ for all $l \in [0, r-1]$, i.e., $\{\hat{x}_i^l\}$, $l \in [0, r-1]$, is an equally sized partition of $[0, r^{m-1}-1]$. Therefore $\{\{\hat{f}_1^l\}_{l=0}^{r-1}, \ldots, \{\hat{f}_{k-1}^l\}_{l=0}^{r-1}\}$ together with $\{\{\hat{X}_1^l\}_{l=0}^{r-1}, \ldots, \{\hat{X}_{k-1}^l\}_{l=0}^{r-1}\}$ is a family of orthogonal permutations, hence by induction $k-1 \le m$ and the result follows.

After presenting the Construction of a code with optimal ratio of $1/r$, we move on to deal with the problem of assigning the proper coefficient in order to satisfy the MDS property. This task turns out to be not easy when the number of parities $r > 2$. The next theorem gives a proper assignment for the code with $r=3$ parities, constructed by the optimal construction given before. This assignment gives an upper bound on the required field size.

Theorem 24. A field of size at most 2(m+1) is sufficient to make the code constructed by Theorem 22 with r=3 parities, a (m+4, m+1) MDS code.

Proof: Let $F_q$ be a field of size $q \geq 2(m+1)$. For any $l \in [0, m]$ let $A_l = (a_{i,j})$ be the representation of the permutation $f_{e_l}^1$, by a permutation matrix with a slight modification and is defined as follows, $$a_{i,j} = \begin{cases} \alpha^j & f_{e_l}^1(j) = i \text{ and } j \cdot e_l = 0 \\ 1 & f_{e_l}^1(j) = i \text{ and } j \cdot e_l \neq 0 \\ 0 & \text{otherwise,} \end{cases}$$

where $\alpha$ is a primitive element of $F_q$. Let W be the matrix that create the parities nodes, defined as $$W = \begin{bmatrix} B_0^0 & B_1^0 & \ldots & B_m^0 \\ B_0^1 & B_1^1 & \ldots & B_m^1 \\ B_0^2 & B_1^2 & \ldots & B_m^2 \end{bmatrix}.$$

Where $B_l^j = (A_l)^j$ for $l \in [0, m]$ and $j \in [0, 2]$. It easy to see that indeed block row $i \in [0,2]$ in the block matrix m corresponds to parity i. We will show that this coefficient assignment satisfy the MDS property of the code. First we will show that under this assignment of coefficients the matrices $A_l$ commute, i.e. for any $l_1 \neq l_2 \in [0, m]$, $A_{l_1} A_{l_2} = A_{l_2} A_{l_1}$. For simplicity, write $$f_{e_{l_1}}^1 = f_1, f_{e_{l_2}}^1 = f_2, A_{l_1} = (a_{i,j}), A_{l_2} = (b_{i,j}), 3^m = p.$$

For a vector $x = (x_0, \ldots, x_{p-1})$ and $y = xA_{l_1}$, its j-th entry satisfies $y_j = a_{f_1(j),j} x_{f_1(j)}$ for all $j \in [0, p-1]$. And by similar calculation, $z = xA_{l_1} A_{l_2} = yA_{l_2}$ will satisfy $$z_j = b_{f_2(j),j} y_{f_2(j)} = b_{f_2(j),j} a_{f_1(f_2(j)),f_2(j)} x_{f_1(f_2(j))}.$$

Similarly, if $w = xA_{l_2} A_{l_1}$, then $$w_j = a_{f_1(j),j} b_{f_2(f_1(j)),f_1(j)} x_{f_2(f_1(j))}.$$

Notice that $$f_1(j) \cdot e_{l_2} = (j + e_{l_1}) e_{l_2} = j \cdot e_{l_2},$$

so $b_{f_2(j),j} = b_{f_2(f_1(j)),f_1(j)}$. Similarly, $a_{f_1(j),j} = a_{f_1(f_2(j)),f_2(j)}$. Moreover, $$f_1(f_2(j)) = f_2(f_1(j)) = j + e_{l_1} + e_{l_2}.$$

Hence, $z_j = w_j$ for all j and $$xA_{l_1} A_{l_2} = z = w = xA_{l_2} A_{l_1}$$

for all $x \in F_3^m$. Thus $A_{l_1} A_{l_2} = A_{l_2} A_{l_1}$.

Next we show for any i, $A_i^3 = \alpha^i I$. For any vector x, Let $y = xA_i^3$. Then $$y_j = a_{f_1(j),j} a_{f_i^2(j),f_i(j)} a_{f_i^3(j),f_i^2(j)} x_{f_i^3(j)}.$$

However, $f_i^3(j) = j + 3e_i = j$ (since the addition is done over $F_3^m$), and exactly one of $j \cdot e_i$, $f_i(j) \cdot e_i$, $f_i^2(j) \cdot e_i$ equals to 0. Thus $y_j = \alpha^i x_j$ or $xA_i^3 = \alpha^i x$ for any x. Hence $A_i^3 = \alpha^i I$.

The code is MDS if it can recover from loss of any three nodes. With this assignment of coefficients the code is MDS iff any block sub matrices of sizes 1×1, 2×2, 3×3 of the matrix M are invertible. Let $0 \leq i < j < k \leq m$ we will see that the matrix $$\begin{bmatrix} I & I & I \\ A_i & A_j & A_k \\ A_i^2 & A_j^2 & A_k^2 \end{bmatrix}$$

is invertible. By Theorem 1 in [J. R. Silvester, *The Mathematical Gazette*, 84:460-467 (November 2000)] and the fact that all the blocks in the matrix commute we get that the determinant of this matrix equals to $\det(A_k - A_j) \cdot \det(A_k - A_i) \cdot \det(A_j - A_i)$. Hence we need to show that for any $i > j$, $\det(A_i - A_j) \neq 0$, which is equivalent to $\det(A_i A_j^{-1} - I) \neq 0$. Note that for any i, $A_i^3 = \alpha^i I$. Denote by $A = A_i A_j^{-1}$, hence $A^3 = (A_i A_j^{-1})^3 = A_i^3 A_j^{-3} = \alpha^{i-j} I \neq I$. Therefore $$0 \neq \det(A^3 - I) = \det(A - I) \det(A^2 + A + I).$$

Therefore $\det(A - I) = \det(A_i A_j^{-1} - I) \neq 0$. For a submatrix of size 2×2, we need to check that for $i > j$ $$\det\left(\begin{bmatrix} I & I \\ A_j^2 & A_i^2 \end{bmatrix}\right) = \det(A_j^2) \det(A_i^2 A_j^{-2} - I) \neq 0.$$

Note that $A^6 = (A_i A_j^{-1})^6 = \alpha^{2(i-j)} I \neq I$ since $$0 < i - j \leq m < \frac{q-1}{2}.$$

Hence $$0 \neq \det(A^6 - I) = \det(A^2 - I)(A^4 + A^2 + I),$$

and $\det(A^2 - I) = \det(A_i^2 A_j^{-2} - I) \neq 0$ which concludes the proof.

For example, the coefficients of the parities in FIG. 7 are assigned as the above proof. Since m=2, the field of size 7 is sufficient. The primitive element is chosen to be 3. One can check that when losing any three columns we can still rebuild them.

VIII. Rebuilding Multiple Erasures

In this section, we discuss the rebuilding of e erasures, where $1 \leq e \leq r$. We will first prove the lower bound for rebuilding ratio and repair bandwidth. Then we show a construction achieving the lower bound for systematic nodes. At last we generalize this construction and Construction 1, and propose a rebuilding algorithm using an arbitrary subgroup and its cosets.

In this section, in order to simplify some of the results we will assume that r is a prime and the calculations are done over $F_r$. Note that all the result can be generalized with minor changes for an arbitrary integer r and the ring $Z_r$.

A. Lower Bounds

The next theorem shows that the rebuilding ratio for Construction 1 is at least e/r.

Theorem 25. Let A be an array with r parity nodes constructed by Construction 5. In an erasure of $1 \leq e \leq r$ systematic nodes, the rebuilding ratio is at least e/r.

Proof: In order to recover the information in the systematic nodes we need to use at least $er^m$ zigzag sets from the $r^{m+1}$ sets (There are r parity nodes, $r^m$ zigzag sets in each parity). By the pigeonhole principle there is at least one parity node, such that at least $er^{m-1}$ of its zigzag sets are used. Hence each remaining systematic node has to access its elements that are contained in these zigzag sets. Therefore each systematic node accesses at least $er^{m-1}$ of its information out of $r^m$, which is a portion of $e/r$.

Since we use at least $er^m$ zigzag sets, we use at least $er^m$ elements in the r parity nodes, which is again a portion of $e/r$. Hence the overall rebuilding ratio is at least $e/r$.

In a general code (not necessary MDS, systematic, or optimal update), what is the amount of information needed to transmit in order to rebuild e nodes? Assume that in the system multiple nodes are erased, and we rebuild these nodes simultaneously from information in the remaining nodes. It should be noted that this model is a bit different from the distributed repair problem, where the recovery of each node is done separately. We follow the definitions and notations of [N. B. Shah et al., Tech. Rep. arXiv:1011.2361v2 (2010)]. An exact-repair reconstructing code satisfies the following two properties: (i) Reconstruction: any k nodes can rebuild the total information; (ii) Exact repair: if e nodes are erased, they can be recovered exactly by transmitting information from the remaining nodes.

Suppose the total amount of information is M, and the n nodes are [n]. For e erasures, $1 \le e \le r$, denote by $\alpha$, $d_e$, $\beta_e$ the amount of information stored in each node, the number of nodes connected to the erased nodes, and the amount of information transmitted by each of the nodes, respectively. For subsets $A, B \subseteq [n]$, $W_A$ is the amount of information stored in nodes A, and $S_A^B$ is the amount of information transmitted from nodes A to nodes B in the rebuilding.

The following results give lower bound of repair bandwidth for e erasures, and the proofs are based on [N. B. Shah et al., Tech. Rep. arXiv:1011.2361v2 (2010)].

Lemma 26. Let $B \subseteq [n]$ be a subset of nodes of size $|e|$, then for an arbitrary set of nodes A, $|A| \le d_e$ such that $B \cap A = \emptyset$, $$H(W_B|W_A) \le \min\{|B|\alpha, (d_e-|A|)\beta_e\}.$$

Proof: If nodes B are erased, consider the case of connecting to them nodes A and nodes C, $|C| = d_e - |A|$. Then the exact repair condition requires $$0 = H(W_B|S_A^B, S_C^B)$$
$$= H(W_B|S_A^B) - I(W_B, S_C^B|S_A^B) \ge$$
$$H(W_B|S_A^B) - H(S_C^B) \ge$$
$$H(W_B|S_A^B) - (d - |A|)\beta_e \ge$$
$$H(W_B|W_A) - (d - |A|)\beta_e$$

Moreover, it is clear that $H(W_B|W_A) \le H(W_B) \le |B|\alpha$ and the result follows.

Theorem 27. Any reconstructing code with file size M must satisfy for any $1 \le e \le r$ $$M \le s\alpha + \sum_{i=0}^{\lfloor \frac{k}{e} \rfloor - 1} \min\{e\alpha, (d_e - ie - s)\beta_e\}$$

where $s = k \mod e$, $0 \le s < e$. Moreover for an MDS code, $$\beta_e \ge \frac{eM}{k(d-k+e)}.$$

Proof: The file can be reconstructed from any set of k nodes, hence $$M = H(W_{[k]})$$
$$= H(W_{[s]}) + \sum_{i=0}^{\lfloor \frac{k}{e} \rfloor - 1} H(W_{[ie+s+1,(i+1)e+s]}|W_{[ie+s]}) \le$$
$$s\alpha + \sum_{i=0}^{\lfloor \frac{k}{e} \rfloor - 1} \min\{e\alpha, (d_e - ie - s)\beta_e\}$$

In an MDS code $$\alpha = \frac{M}{k},$$

hence in order to satisfy the inequality any summand of the form $\min \{e\alpha, (d_e-ie-s)\beta_e\}$ must be at least $$e\frac{M}{k},$$

which occurs if and only if $$\left(d_e - \left(\left\lfloor \frac{k}{e} \right\rfloor - 1\right)e - s\right)\beta_e \ge \frac{eM}{k}.$$

Hence we get $$\beta_e \ge \frac{eM}{k(d-k+e)}.$$

And the proof is completed.

Therefore, the lower bound of the repair bandwidth for an MDS code is $$\frac{eM}{k(d-k+e)},$$

which is the same as the lower bound of the rebuilding ratio in Theorem 25.

B. Rebuilding Algorithms

Next we discuss how to rebuild in case of e erasures, $1 \le e \le r$, for an MDS array code with optimal update. Theorem 27 gives the lower bound $e/r$ on the rebuilding ratio for e erasures. Is this achievable? Let us first look at an example.

Example 3

Consider the code in FIG. 5 with r=3. When e=2 and columns $C_0$, $C_1$ are erased, we can access rows $\{0,1,3,4,6,7\}$ in column $C_2$, $C_3$ rows $\{1,2,4,5,7,8\}$ in column $C_4$, and rows $\{2,0,5,3,8,6\}$ in column $C_5$. One can check that the accessed elements are sufficient to rebuild the two erased columns, and the ratio is $2/3 = e/r$. It can be shown that similar rebuilding can be done for any two systematic node erasures. Therefore, in this example the lower bound is achieved.

For an array of size p×k an (n,k) MDS code with r=n−k parity nodes is constructed. Each parity node l∈[0, r−1] is constructed from the set of permutations $\{f_i^l\}$ for i∈[0,k−1]. Notice that in the general case the number of rows p in the array is not necessarily a power of r. We will assume columns [0, e−1] are erased. In an erasure of e columns, ep elements need rebuilt, hence we need ep equations (zigzags) that contain these elements. In an optimal rebuilding, each parity node contributes ep/r equations by accessing the values of ep/r of its zigzag elements. Moreover, the union of the zigzag sets that create these zigzag elements, constitute an e/r portion of the elements in the surviving systematic nodes. In other words, there is a set X⊆[0, p−1], such that |X|=ep/r and $$f_j^l(X) = f_i^l(X)$$

for any parity node l∈[0, r−1] and surviving systematic nodes i, j∈[e, k−1]. Note that it is equivalent that for any parity node l∈[0, r−1] and surviving systematic node j∈[e, k−1]

$$f_j^l(X) = f_e^l(X).$$

Let $G^l$ be the subgroup of $S_p$ that is generated by the set of permutations $\{f_e^{-1} \circ f_j^l\}_{j=e}^{k-1}$. It is easy to see that the previous condition is also equivalent to that for any parity l∈[0, r−1] the group $G^l$ stabilizes X, i.e., for any $f \in G^l$, $f(X)=X$.

Assuming there is a set X that satisfies this condition, we have to guarantee that indeed the ep elements can be rebuilt from the chosen ep equations, i.e., make sure that the ep equations with the ep variables are solvable. A necessary condition is that each element in the erased column will appear at least once in the chosen zigzag sets (equations). parity l∈[0, r−1] accesses its zigzag elements $f_e^l(X)$, and these zigzag sets contain the elements in rows $(f_i^l)^{-1} f_e^l(X)$ of the erased column i∈[0, e−1]. Hence the condition is equivalent to that for any erased column i∈[0, e−1]

$$\cup_{l=0}^{r-1} (f_i^l)^{-1} f_e^l(X) = [0, p-1].$$

These two conditions are necessary for optimal rebuilding ratio. In addition, we need to make sure that the ep equations are linearly independent, which it depends on the coefficients in the linear combinations that created the zigzag elements. These three conditions are necessary and sufficient conditions for optimal rebuilding ratio of e erasures. We summarize:

Sufficient and necessary conditions for optimal rebuilding ratio in e erasures:
There exists a set X⊆[0, p−1] of size |X|=ep/r, such that
  (1) For any parity node l∈[0, e−1] the group $G^l$ stabilizes the set X, i.e., for any $g \in G^l$ $$g(X) = X \quad (34)$$

where $G^l$ is generated by the set of permutations $\{f_e^{-1} \circ f_j^l\}_{j=e}^{k-1}$.
  (2) For any erased column i∈[0, e−1], $$\cup_{l=0}^{r-1} (f_i^l)^{-1} f_e^l(X) = [0, p-1]. \quad (35)$$

(3) The ep equations (zigzag sets) defined by the set X are linearly independent.

The previous discussion gave the condition for optimal rebuilding ratio in an MDS optimal update code with e erasures. Next will interpret these conditions in the special case where the number of rows p=$r^m$, and the permutations are generated by T={$v_0, v_1, \ldots, v_{k-1}$}⊆$F_r^m$ and Construction 5, i.e., $f_i^l(x) = x + l v_i$ for any x∈[0, $r^m$−1]. Note that in the case of r a prime $$G^1 = G^2 = \ldots = G^{r-1},$$

and in that case we simply denote the group as G. The following theorem gives a simple characterization for sets that satisfy condition 1.

Theorem 28. Let X⊆$F_r^m$ and G defined above then G stabilizes X, if and only if X is a union of cosets of the subspace $$Z = \text{span}\{v_{e+1} - v_e, \ldots, v_{k-1} - v_e\}. \quad (36)$$

Proof: It is easy to check that any coset of Z is stabilized by G, hence if X is a union of cosets it is also a stabilized set. For the other direction let x, y∈$F_r^m$ be two vectors in the same coset of Z, it is enough to show that if x∈X then also y∈X. Since y−x∈Z there exist $\alpha_1, \ldots, \alpha_{k-1-e} \in [0, r-1]$ such that y−x=$\sum_{i=1}^{k-1-e} \alpha_i (v_{e+i} - v_e)$. Since $f(X) = X$ for any $f \in G$ we get that $f(x) \in X$ for any x∈X and $f \in G$, hence $$y = x + y - x$$
$$= x + \sum_{i=1}^{k-1-e} \alpha_i (v_{e+i} - v_e)$$
$$= f_e^{-\alpha_{k-1-e}} f_{k-1}^{\alpha_{k-1-e}} \ldots f_e^{-\alpha_1} f_{e+1}^{\alpha_1}(x),$$

for $f_e^{-\alpha_{k-1-e}} f_{k-1}^{\alpha_{k-1-e}} \ldots f_e^{-\alpha_1} f_{e+1}^{\alpha_1} \in G$ and the result follows.

Remark: For any set of vectors S and v, u∈S, $$\text{span}\{S - v\} = \text{span}\{S - u\}.$$

Where, S−v={$v_i - v | v_i \in S$}. Hence, the subspace Z defined in the previous theorem does not depend on the choice of the vector $v_e$. By the previous theorem we interpret the necessary and sufficient conditions of an optimal code as follows:

There exists a set X⊆$F_r^m$ of size |X|=$er^{m-1}$, such that
  (1) X is a union of cosets of $$Z = \text{span}\{v_{e+1} - v_e, \ldots, v_{k-1} - v_e\}.$$

(2) For any erased column i∈[0, e−1], $$\cup_{l=0}^{r-1} (X + l(v_i - v_e)) = F_r^m. \quad (37)$$

(3) The $er^m$ equations (zigzag sets) defined by the set X are linearly independent.

The following theorem gives a simple equivalent condition for conditions 1, 2.

Theorem 29. There exists a set X⊆$F_r^m$ of size |X|=$er^{m-1}$ such that conditions 1, 2 are satisfied if and only if $$v_i - v_e \notin Z, \quad (38)$$

for any erased column i∈[0, e−1].

Proof: Assume conditions 1, 2 are satisfied. If $v_i - v_e \in Z$ for some erased column i∈[0, e−1] then X$\cup_{l=0}^{r-1}(X + l(v_i - v_e)) = F_r^m$. Which is a contradiction to that X⊂$F_r^m$. On the other hand, if Equation (38) is true, then $v_i - v_e$ can be viewed as a permutation that acts on the cosets of Z. The number of cosets of Z is $r^m/|Z|$ and this permutation (when it is written in cycle notation) contains $r^{m-1}/|Z|$ cycles, each with length r. For each i∈[0, e−1] choose $r^{m-1}/|Z|$ cosets of Z, one from each cycle of the permutation $v_i - v_e$. In total $er^{m-1}/|Z|$ cosets are chosen for the e erased nodes. Let X be the union of the cosets that were chosen. It is easy to see that X satisfies condition 2 above. If |X|<$er^{m-1}$ (Since there might be cosets that were chosen more than once) add arbitrary ($er^{m-1}-|X|$)/|Z| other cosets of Z, and also condition 1 is satisfied.

In general, if Equation (38) is not satisfied, the code does not have an optimal rebuilding ratio. However we can define $$Z = \text{span}\{v_i - v_e\}_{i \in I}, \quad (39)$$

where we assume w.l.o.g. $e \in I$ and $I \subseteq [e, k-1]$ is a maximal subset of surviving nodes that satisfies for any erased node $j \in [0, e-1]$, $v_j - v_e \in Z$. Hence from now on we assume that Z is defined by a subset of surviving nodes I. This set of surviving nodes will have an optimal rebuilding ratio (see Corollary 32), i.e., in the rebuilding of columns $[0, e-1]$, columns I will access a portion of $e/r$ of their elements. The following theorem gives a sufficient condition for the $er^m$ equations defined by the set X to be solvable linear equations.

Theorem 30. Suppose that there exists a subspace $X_0$ that contains Z such that for any erased node $i \in [0, e-1]$ $$X_0 \oplus \text{span}\{v_i - v_e\} = \mathbb{F}_r^m, \tag{40}$$

then the set X defined as an union of some e cosets of $X_0$ satisfies conditions 1, 2 and 3 over a field large enough.

Proof: Condition 1 is trivial. Note that by Equation (40) above, $1(v_i - v_e) \notin X_0$ for any $l \in [1, r-1]$ and $i \in [0, e-1]$, hence $\{X_0 + l(v_i - v_e)\}_{l \in [0, r-1]}$ is the set of cosets of $X_0$. Let $X_j = X_0 + j(v_i - v_e)$ be a coset of $X_0$ for some $i \in [0, e-1]$ and suppose $X_j \subset X$.

$$\bigcup_{l=0}^{r-1}(X + l(v_i - v_e)) \supseteq \bigcup_{l=0}^{r-1}(X_j + l(v_i - v_e)) = \tag{41}$$

$$\bigcup_{l=0}^{r-1}(X_0 + j(v_i - v_e) + l(v_i - v_e)) =$$

$$\bigcup_{l=0}^{r-1}(X_0 + (j+l)(v_i - v_e)) = \bigcup_{t=0}^{r-1}(X_0 + t(v_i - v_e))$$

$$= \mathbb{F}_r^m. \tag{42}$$

Equation (41) holds, since $j+l$ is computed mod r. So condition 2 is satisfied. Next we prove condition 3. There are $er^m$ unknowns and $er^m$ equations. Writing the equations in a matrix form we get $AY=b$, where A is an $er^m \times er^m$ matrix. Y, b are vectors of length $er^m$, and $Y=(y_1, \ldots, y_{er^m})^T$ is the unknowns vector. The matrix $A=(a_{i,j})$ is defined as $a_{i,j}=x_{i,j}$ if the unknown $y_j$ appears in the i-th equation, otherwise $a_{i,j}=0$. Hence we can solve the equations if and only if there is assignment for the indetermediates $\{x_{i,j}\}$ in the matrix A such that $\det(A) \neq 0$. By Equation (42), accessing rows corresponding to any coset $X_j$ will give us equations where each unknown appears exactly once. Since X is a union of e cosets, each unkown appears e times in the equations. Thus each column in A contains e indeterminates. Moreover, each equation contains one unknown from each erased node, thus any row in A contains e indeterminates. Then by Hall's marriage Theorem [P. Hall, *J. London Math. Soc.*, 10(1):26-30 (1935)] we conclude that there exists a permutation f on the integers $[1, er^m]$ such that $$\prod_{i=1}^{er^m} a_{i,f(i)} \neq 0.$$

Hence the polynomial $\det(A)$ when viewed as a symbolic polynomial, is not the zero polynomial, i.e., $$\det(A) = \sum_{f \in S_{er^m}} \text{sgn}(f) \prod_{i=1}^{er^m} a_{i,f(i)} \neq 0.$$

By Theorem 2 we conclude that there is an assignment from a field large enough for the indeterminates such that $\det(A) \neq 0$, and the equations are solvable. Note that this proof is for a specific set of erased nodes. However if Equation (40) is satisfied for any set of e erasures, multiplication of all the nonzero polynomials $\det(A)$ derived for any set of erased nodes is again a nonzero polynomial and by the same argument there is an assignment over a field large enough such that any of the matrices A is invertible, and the result follows.

In order to use Theorem 30, we need to find a subspace $X_0$ as in Equation (40). The following Theorem shows that such a subspace always exists, moreover it gives an explicit construction of it.

Theorem 31. Suppose $1 \leq e < r$ erasures occur. Let Z be defined by Equation (39) and $v_i - v_e \in Z$ for any erased node $i \in [0, e-1]$. Then there exists $u \perp Z$ such that for any $i \in [0, e-1]$, $$u \cdot (v_i - v_e) \neq 0. \tag{43}$$

Moreover the orthogonal subspace $X_0 = (u)^\perp$ satisfies Equation (40).

Proof: First we will show that such vector u exists. Let $u_1, \ldots u_t$ be a basis for $(Z)^\perp$ the orthogonal subspace of Z. Any vector u in $(Z)^\perp$ can be written as $u = \sum_{j=1}^t x_j u_j$ for some $x_j$'s. We claim that for any $i \in [0, e-1]$ there exists j such that $u_j \cdot (v_i - v_e) \neq 0$. Because otherwise, $(Z)^\perp = \text{span}\{u_1, \ldots, u_t\} \perp v_i - v_e$, which means $v_i - v_e \in Z$ and reaches a contradiction. Thus the number of solutions for the linear equation $$\sum_{j=1}^t x_j u_j \cdot (v_i - v_e) = 0$$

is $r^{t-1}$, which equals the number of u such that $u \cdot (v_i - v_e) = 0$. Hence by the union bound there are at most $er^{t-1}$ vectors u in $(Z)^\perp$ such that $u \cdot (v_i - v_e) = 0$ for some erased node $i \in [0, e-1]$. Since $|(Z)^\perp| = r^t > er^{t-1}$ there exists u in $(Z)^\perp$ such that for any erased node $i \in [0, e-1]$, $$u \cdot (v_i - v_e) \neq 0.$$

Define $X_0 = (u)^\perp$, and note that for any erased node $i \in [0, e-1]$, $v_i - v_e \notin X_0$, since $u \cdot (v_i - v_e) \neq 0$ and $X_0$ is the orthogonal subspace of u. Moreover, since $X_0$ is a hyperplane we conclude that $$X_0 \oplus \text{span}\{v_i - v_e\} = \mathbb{F}_r^m,$$

and the result follows.

Theorems 30 and 31 give us an algorithm to rebuild multiple erasures:
(1) Find Z by Equation (34) satisfying Equation (33).
2) Find $u \perp Z$ satisfying Equation (38); define $X_0 = (u) \perp$ and X as a union of e cosets of $X_0$.
3) Access rows $f_e^i(X)$ in parity $i \in [0, r-1]$ and all the corresponding information elements.

We know that under a proper selection of coefficients the rebuilding is possible.

In the following we give two examples of rebuilding using this algorithm. The first example shows an optimal rebuilding for any set of e node erasures. As mentioned above, the optimal rebuilding is achieved since Equation (38) is satisfied, i.e., $I = [e, k-1]$.

Example 4

Let $T = \{v_0, v_1, \ldots, v_m\}$ be a set of vectors that contains an orthonormal basis of $\mathbb{F}_r^m$ together with the zero vector. Suppose columns $[0, e-1]$ are erased. Note that in that case $I = [e, k-1]$ and Z is defined as in Equation (39). Define $$u = \sum_{j=e}^{m} v_j,$$

and $X_0=(u)^\perp$. When $m=r$ and $e=r-1$, modify $u$ to be $$u = \sum_{i=1}^{m} v_i.$$

It is easy to check that $u \perp Z$ and for any erased column $i \in [0, e-1]$, $u \cdot (v_i - v_e) = -1$. Therefore by Theorems 30 and 31 a set X defined as a union of an arbitrary $e$ cosets of $X_0$ satisfies conditions 1, 2, and 3, and optimal rebuilding is achieved.

In the example of FIG. 7, we know that the vectors generating the permutations are the standard basis (and thus are orthonormal basis) and the zero vector. When columns $C_0$, $C_1$ are erased, $u=e_2$ and $X_0=(u)^\perp=\text{span}\{e_1\}=\{0,3,6\}$. Take X as the union of $X_0$ and its coset $\{1,4,7\}$, which is the same as Example 3. One can check that each erased element appears exactly three times in the equations and the equations are solvable in $F_7$. Similarly, the equations are solvable for other two systematic erasures.

Before we proceed to the next example, we give an upper bound for the rebuilding ratio using Theorem 30 and a set of nodes I.

Corollary 32. Theorem 30 requires rebuilding ratio at most $$\frac{e}{r} + \frac{(r-e)(k-|I|-e)}{r(k+r-e)}$$

Proof: By Theorem 29, the fraction of accessed elements in columns I and the parity columns is $e/r$ of each column. Moreover, the accessed elements in the rest columns are at most an entire column. Therefore, the ratio is at most $$\frac{\frac{e}{r}(|I|+r)+(k-|I|-e)}{k+r-e} = \frac{e}{r} + \frac{(r-e)(k-|I|-e)}{r(k+r-e)}$$

and the result follows.

Note that as expected when $|I|=k-e$ the rebuilding ratio is optimal, i.e. $e/r$. In the following example the code has $O(m^2)$ columns. The set I does not contain all the surviving systematic nodes, hence the rebuilding is not optimal but is at most $$\frac{1}{2} + O\left(\frac{1}{m}\right).$$

Example 5

Suppose $2|m$. Let $T = \{v=(v_1, \ldots, v_m): \|v\|_1 = 2, v_i = 1, v_j = 1,$ for some $i \in [1, m/2], j \in [m/2+1, m]\} \subset F_r^m$ be the set of vectors generating the code with $r=2$ parities, hence the number of systematic nodes is $|T|=k=m^2/4$. Suppose column $w = \{w_1, \ldots, w_m\}$, $w_1 = w_{m/2+1} = 1$ was erased. Define the set $I = \{v \in T : v_1 = 0\}$, and $$Z = \text{span}\{v_1 - v_e | i \in I\}$$

for some $e \in I$. Thus $|I|=m(m-2)/4$. It can be seen that Z defined by the set I satisfies Equation (38), i.e., $w-v_e \in Z$ since the first coordinate of a vector in Z is always 0, as opposed to 1 for the vector $w-v_e$. Define $u=(0, 1, \ldots, 1)$ and $X_0=(u)^\perp$. It is easy to check that $u \perp Z$ and $u \cdot (w-v_e) = 1 \neq 0$. Hence, the conditions in Theorem (31) are satisfied and a rebuilding can be done using one of the two cosets of $x_0$. Moreover, by Corollary 32 the rebuilding ratio is at most $$\frac{1}{2} + \frac{1}{2}\frac{(m/2)-1}{(m^2/4)+1} \approx \frac{1}{2} + \frac{1}{m},$$

which is a little better than Theorem 18 in the constants. Note that by similar coefficients assignment of Construction 4, we can use a field of size five or eight to assure the code will be an MDS code.

C. Minimum Number of Erasures with Optimal Rebuilding

Next we want to point out a surprising phenomenon. We say that a set of vectors S satisfies property $e$ for $e \geq 1$ if for any subset $A \subseteq S$ of size $e$ and any $e \in A$, $$u-v \in \text{span}\{w-v : w \in S \setminus A\},$$

where $v \in S \setminus A$. Recall that by Theorem 29 any set of vectors that generates a code C and can rebuild optimally any $e$ erasures, satisfies property $e$. The following theorem shows that this property is monotonic, i.e., if S satisfies property $e$ then it also satisfies property $a$ for any $e \leq a \leq |S|$.

Theorem 33. Let S be a set of vectors that satisfies property $e$, then it also satisfies property $a$, for any $e \leq a \leq |s|$.

Proof: Let $A \subseteq S$, $|A|=e+1$ and assume to the contrary that $u-v \in \text{span}\{w-v : w \in S \setminus A\}$ for some $u \in A$ and $v \in S \setminus A$. $|A| \geq 2$ hence there exists $x \in A \setminus u$. It is easy to verify that $u-v \in \text{span}\{w-v : w \in S \setminus A^*\}$, where $A^* = A \setminus x$ and $|A^*|=e$ which contradicts the property $e$ for the set S.

Hence, from the previous theorem we conclude that a code C that can rebuild optimally $e$ erasures, is able to rebuild optimally any number of erasures greater than $e$ as well. However, as pointed out already there are codes with $r$ parities that can not rebuild optimally from some $e < r$ erasures. Therefore, one might expect to find a code C with parameter $e^* \geq 1$ such that it can rebuild optimally $e$ erasures only when $e^* \leq e \leq r$. For example, for $r=3$, $m=2$ let C be the code constructed by the vectors $\{0, e_1, e_2, e_1+e_2\}$. We know that any code with more than 3 systematic nodes cannot rebuild one erasure optimally, since the size of a family of orthogonal permutations over the integers $[0, 3^2-1]$ is at most 3. However, one can check that for any two erased columns, the conditions in Theorem 30 are satisfied hence the code can rebuild optimally for any $e=2$ erasures and we conclude that $e^*=2$ for this code.

The phenomena that some codes has a threshold parameter $e^*$, such that only when the number of erasures $e$ is at least as the threshold $e^*$ then the code can rebuild optimally, is a bit counter intuitive and surprising. This phenomena gives rise to another question. We know that for a code constructed with vectors from $F_r^m$, the maximum number of systematic columns for optimal rebuilding of $e=1$ erasures is $m+1$ (Theorem 23). Can the number of systematic columns in a code with an optimal rebuilding of $e>1$ erasures be increased? The previous example shows a code with four systematic columns can rebuild optimally any $e=2$ erasures. But Theorem 23 shows that when $r=3$, $m=2$, optimal rebuilding for one erasure implies no more than three systematic columns. Hence the number of systematic columns is increased by at least 1 compared to codes with nine rows and optimal rebuilding of one erasure. The following theorem gives an upper bound for the maximum systematic columns in a code that rebuilds optimally any e erasures.

Theorem 34. Let C be a code constructed by Construction 5 and vectors from $F_r^m$. If C can rebuild optimally any e erasures, for some $1 \le e < r$, then the number of systematic columns k in the code satisfies $k \le m+e$.

Proof: Consider a code with length k and generated by vectors $v_0, v_1, \ldots, v_{k-1}$. If these vectors are linearly independent then $k \le m$ and we are done. Otherwise they are dependent. Suppose e columns are erased, $1 \le e < r$. Let $v_e$ ye be a surviving column. Consider a new set a of vectors: $T = \{v_i - v_e: i \in [0, k-1], i \ne e\}$. We know that the code can rebuild optimally only if Equation (38) is satisfied for all possible e erasures. Thus for any $i \ne e$, $i \in [0, k-1]$, if column i is erased and column e is not, we have $v_i - v_e \notin Z$ and thus $v_i - v_e \ne 0$. So every vector in T is nonzero. Let s be the minimum number of dependent vectors in T, that is, the minimum number of vectors in T such that they are dependent. For nonzero vectors, we have $s \ge 2$. Say $\{v_{e+1} - v_e, v_{e+2} - v_e, \ldots, v_{e+s} - v_e\}$ is a minimum dependent set of vector. Since any $m+1$ vectors are dependent in $F_r^m$, $s \le m+1$.

We are going to show $k - e \le s - 1$. Suppose to the contrary that the number of remaining columns satisfies $k - e \ge s$ and e erasures occur. When column $v_{e+s}$ is erased and the s columns $\{v_e, v_{e+1}, \ldots, v_{e+s-1}\}$ are not, we should be able to rebuild optimally. However since we chose a dependent set of vectors, $v_{e+s} - v_e$ is a linear combination of $\{v_{e+1} - v_e, v_{e+2} - v_e, \ldots, v_{e+s-1} - v_e\}$, whose span is contained in Z in Equation (38). Hence Equation (38) is violated and we reach a contradiction. Therefore, $k - e \le s - 1 \le m$.

Notice that this upper bound is tight. For e=1 we already gave codes with optimal rebuilding of one erasure and $k = m+1$ systematic columns. Moreover, for e=2 the code already presented in this section and is constructed by the vectors $0, e_1, e_2, e_1+e_2$, reaches the upper bound with k=4 systematic columns.

D. Generalized Rebuilding Algorithms

The rebuilding algorithms presented in Constructions 1 and 5 and in Theorem 30 all use a specific subspace and its cosets in the rebuilding process. This method of rebuilding can be generalized by using an arbitrary subspace as explained below.

Let $T = \{v_0, \ldots, v_{k-1}\}$ be a set of vectors generating the code in Construction 5 with $r^m$ rows and r parities. Suppose e columns $[0, e-1]$ are erased. Let Z be a proper subspace of $F_r^m$. In order to rebuild the erased nodes, in each parity column $l \in [0, r-1]$, access the zigzag elements $z_i^l$ for $i \in X_l$, and $X_l$ is a union of cosets of Z. In each surviving node, access all the elements that are in the zigzag sets $X_l$ of parity l. More specifically, access element $a_{i,j}$ in the surviving column $j \in [e, k-1]$ if $i + lv_j \in X_l$. Hence, in the surviving column j and parity l, we access elements in rows $X_l - lv_j$. In order to make the rebuilding successful we impose the following conditions on the sets $X_0, \ldots, X_l$. Since the number of equations needed is at least as the number of erased elements, we require $$\sum_{l=0}^{r-1} |X_l| = er^m. \quad (44)$$

Moreover, we want the equations to be solvable, hence for any erased column $i \in [0, e-1]$, $$\cup_{l=0}^{r-1} X_l - lv_i = [0, r^m - 1] \text{ multiplicity } e, \quad (45)$$

which means if the union is viewed as a multi-set, then each element in $[0, r^m - 1]$ appears exactly e times. This condition makes sure that the equations are solvable by Hall's theorem (see Theorem 30). Under these conditions we would like to minimize the ratio, i.e., the number of accesses which is, $$\min_{X_0, \ldots, X_{r-1}} \sum_{j=e}^{k-1} |\cup_{l=0}^{r-1} (X_l = lv_j)|. \quad (46)$$

In summary, for the generalized rebuilding algorithm one first chooses a subspace Z, and then solves the minimization problem in (46) subject to (44) and (45).

The following example interprets the minimization problem for a specific case.

Example 6

Let r=2, e=1, i.e., two parities and one erasure, then Equations (44), (45) become $|X_0| + |X_1| = 2^m, X_0 \cup X_1 + v_0 = [0, 2^m - 1]$.

Therefore $X_1 + v_0 = \overline{X_0}$. The objective function in Equation (46) becomes, $$\min_{X_0, X_1} \sum_{j=1}^{k-1} |X_0 \cup X_1 + v_j| = \min_{X_0} \sum_{j=1}^{k-1} |X_0 \cup (\overline{X_0} + v_0 + v_j)|.$$

Each $v_0 + v_j$ defines a permutation $f_{v_0+v_j}$ on the cosets of Z by $f_{v_0+v_j}(A) = A + v_0 + v_j$ for a coset A of Z. If $v_0 + v_j \in Z$ then $f_{v_0+v_j}$ is the identity permutation and $|X_0 \cup (\overline{X_0} + v_0 + v_j)| = 2^m$, regardless of the choice of $X_0$. However, if $v_0 + v_j \notin Z$, then $f_{v_0+v_j}$ is of order 2, i.e., it's composed of disjoint cycles of length 2. Note that if $f_{v_0+v_j}$ maps A to B and only one of the cosets A, B is contained in $X_0$, say A, then only A is contained in $X_0 \cup (\overline{X_0} + v_0 + v_j)$. On the other hand, if both A, $B \in X_0$ or A, $B \notin X_0$ then, $A, B \subseteq X_0 \cup (\overline{X_0} + v_0 + v_j)$.

In other words, (A, B) is a cycle in $f_{v_0+v_j}$ which is totally contained in $X_0$ or in $\overline{X_0}$. Define $N_j^X$ as the number of cycles (A, B) in the permutation $f_{v_0+v_j}$ that are totally contained in X or in $\overline{X}$, where X is a union of some cosets of Z. It is easy to see that the minimization problem is equivalent to minimizing $$\min_X \sum_{j=1}^{k-1} N_j^X. \quad (47)$$

In other words, we want to find a set X which is a union of cosets of Z, such that the number of totally contained or totally not contained cycles in the permutations defined by $v_j + v_0, j \in [1, k-1]$ is minimized.

From the above example, we can see that given a non-optimal code with two parities and one erasure, finding the solution in Equation (47) requires minimizing for the sum of these k−1 permutations, which is an interesting combinatorial problem. Moreover, by choosing a different subspace Z we might be able to get a better rebuilding algorithm than that in Construction 1 or Theorem 30.

IX. Physical Implementations

In this discussion, we described explicit constructions of the first known systematic (n,k) MDS array codes with n−k equal to some constant, such that the amount of information needed to rebuild an erased column equals to 1/(n−k), which matches the information-theoretic lower bound. Codes constructed according to these principles may be utilized in RAID storage arrays through implementation in RAID controllers. Such RAID controllers will generate parity data according to the code principles described herein and will perform read, write, and rebuilding operations using such codes. The structure and operation of such controllers will be described next, for purposes of illustration.

A. RAID Controller

Figure 8:
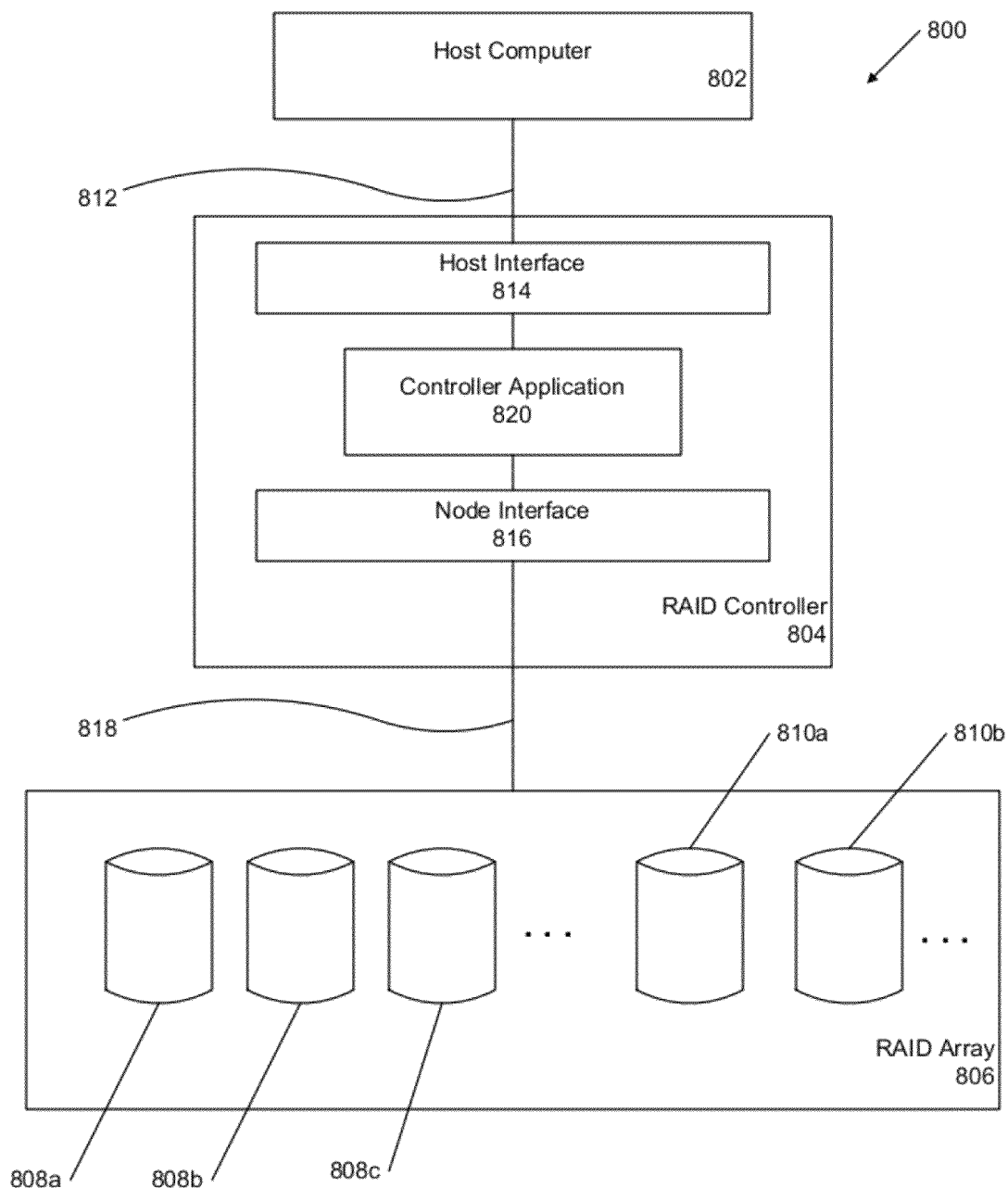
FIG. 8 shows a block diagram of a RAID storage system constructed in accordance with the disclosure.

FIG. 8 shows a block diagram of a RAID storage system 800 constructed in accordance with the disclosure. In the system 800, a host computer 802 communicates with a RAID controller 804 to write and read data to and from a RAID array 806. The RAID array comprises multiple systematic nodes 808a, 808b, 808c of user data and multiple parity nodes 810a, 810b of parity data. The nodes will be referred to collectively by their numerals, without letter suffix, unless identification of particular nodes is desired. Each of the systematic nodes 808 and parity nodes 810 may comprise a single disk drive, or multiple drives, or RAID arrays. The collection of systematic nodes 808 and parity nodes 810 may comprise one or more nodes, in any number according to the system resources, as indicated by the ellipses in FIG. 8.

The RAID controller 804 communicates with the host computer 802 over a host transport medium 812 through a host interface 814. The host transport medium may comprise, for example, a network connection that is wired or wireless, or it may comprise a system connection such as a system bus or the like. The host interface may comprise, for example, a network interface card or other means for communications. The RAID controller 804 communicates with the nodes 808, 810 of the RAID array 806 over an array transport medium 818 through a node interface 816. The array transport medium may comprise, for example, a network connection that is wired or wireless, or may comprise a system connection such as a system bus or the like. The node interface may comprise, for example, a network interface card or other means for communications.

The RAID controller 804 comprises a computer device and, as described further below, as such the RAID controller includes memory and a central processor unit, providing an operating system of the RAID controller. A controller application 820 operates in the RAID controller, supported by the operating system of the RAID controller, such that the controller application manages communications through the host interface 814 and the node interface 816, and also manages code generation for the write and read operations with the RAID array and any rebuilding operations upon node erasure.

Figure 9:
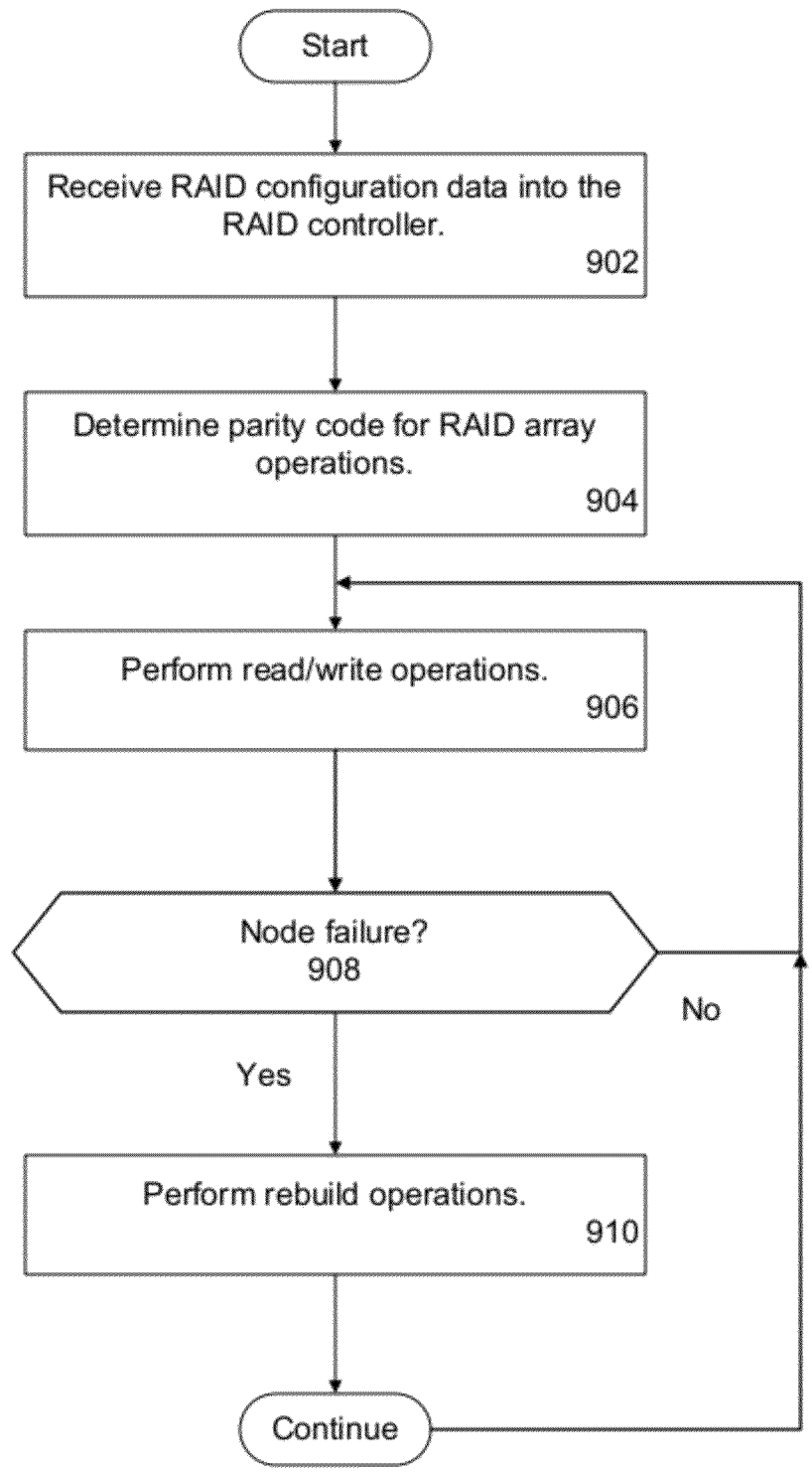
FIG. 9 shows a flow diagram of the operations performed by the RAID controller of FIG. 8.

FIG. 9 shows a flow diagram of the operations performed by the RAID controller 804 of FIG. 8. In the operation indicated by box 902 of FIG. 9, the RAID controller receives RAID configuration data for the RAID array. The configuration data includes, for example, a specification of the nodes in the array, including the location of the nodes, the storage capacity of the nodes, the number of nodes, and other information necessary for the RAID controller to configure and manage operations for the RAID array.

After the RAID configuration data has been received, the RAID controller can determine the parity code to be used for the RAID array operations at box 904. The determination of the code is performed in accordance with the principles in this disclosure. The particular code to be used will be selected in accordance with system resources and in accordance with any predetermined features that are implemented in the controller application.

After the configuration data has been received and the RAID controller has determined the parity code to be used, the read and write data operations with the RAID array may be performed by the RAID controller. Such operations are represented by the next box 906 in FIG. 9. If an erasure occurs, such as a node failure, then the RAID controller detects the event and takes corrective action according to the decision box 908. The RAID controller may indicate a node erasure if, for example, a write failure or read failure occurs. Upon detecting the erasure, an affirmative outcome at the box 908, then the RAID controller performs a rebuild operation as described above, in accordance with the principles of this disclosure. Performing the rebuild operation is indicated at the box 910. If no erasure event is detected, a negative outcome at the decision box 908, then the RAID controller continues with read and write operations of the RAID array, as indicated by the return of controller operations from the decision box 908 to reading and writing at the box 906.

It should be understood that the operation of receiving RAID configuration data (box 902 of FIG. 9) may be performed upon initiation by a user through the host computer. That is, configuration of the RAID array need not await an initial setup operation or a node failure. Rather, configuration of the RAID array according to the controller application may be initiated upon user command, with operations to follow as illustrated in FIG. 9.

B. Computer System

Figure 10:
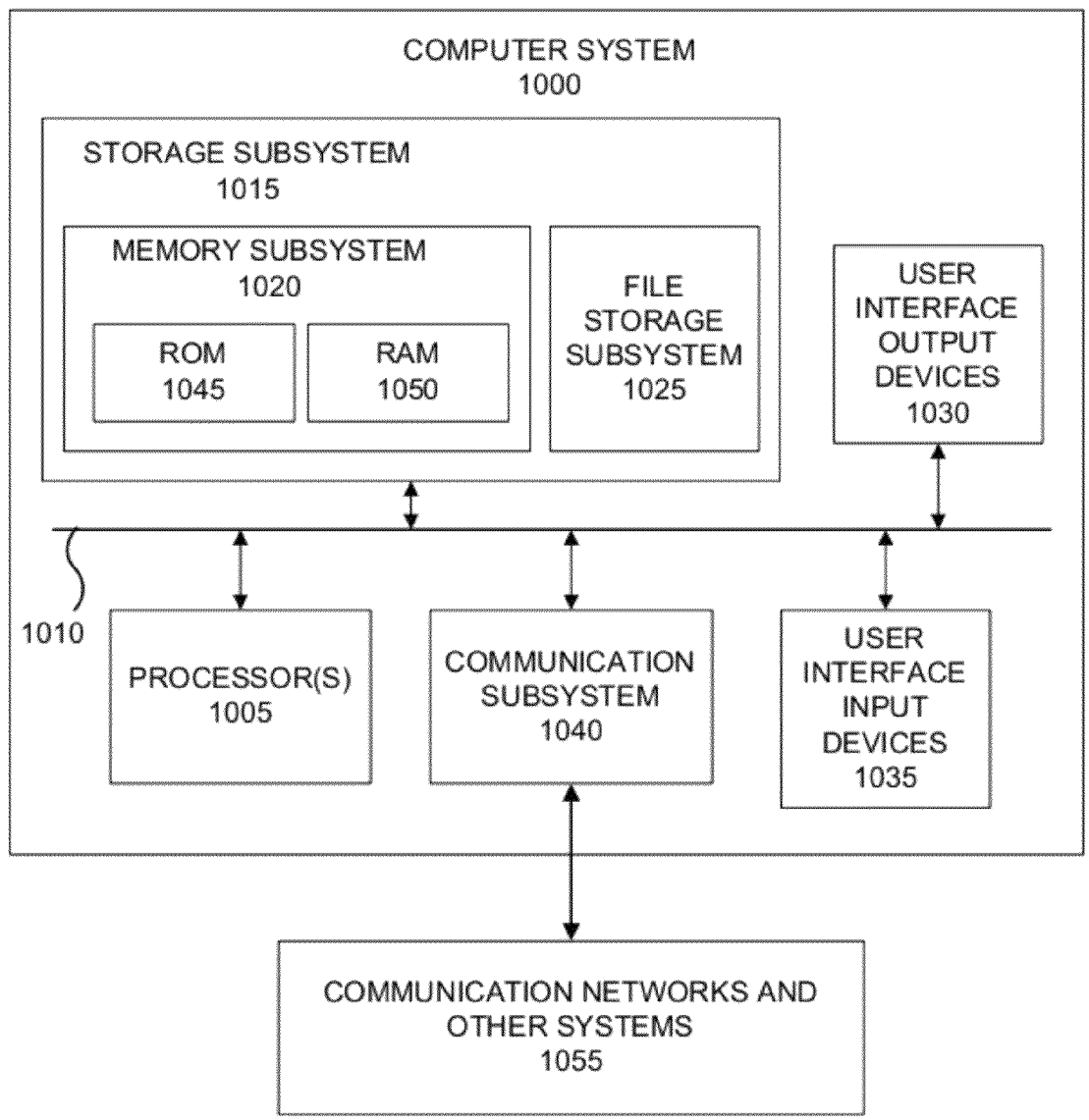
FIG. 10 shows a block diagram of a computer system such as utilized as the RAID controller or host computer of FIG. 8.

FIG. 10 shows a block diagram of a computer system such as utilized as either or both of the RAID controller and host computer of FIG. 8.

The operations described above for operating a RAID array, for reading data from a RAID array, for writing data to a RAID array, and for rebuilding a RAID array, can be carried out by the operations depicted in FIG. 9, which can be performed by the controller application 820 and associated components of the RAID controller 804 illustrated in FIG. 8. The controller application may be installed in a variety of computer devices that control and manage operations of an associated RAID array. For example, in an implementation of the coding scheme described herein within a single controller device, all the components of the RAID controller 804 depicted in FIG. 8 can be contained within firmware of a controller device that communicates with a host computer and RAID nodes.

The processing components such as the controller application 820 and host interface 814 and node interface 816 may be implemented in the form of control logic in software or hardware or a combination of both, and may comprise processors that execute software program instructions from program memory, or as firmware, or the like. The host computer 802 may comprise a conventional computer apparatus. A conventional computer apparatus also may carry out the operations of FIG. 9. For example, all the components of the RAID controller can be provided by applications that are installed on the computer system illustrated in FIG. 10. FIG. 10 is a block diagram of a computer apparatus 1000 sufficient to perform as a host computer and a RAID controller, and sufficient to perform the operations of FIG. 9.

FIG. 10 is a block diagram of a computer system 1000 that may incorporate embodiments of the present invention and perform the operations described herein. The computer system 1000 typically includes one or more processors 1005, a system bus 1010, storage subsystem 1015 that includes a memory subsystem 1020 and a file storage subsystem 1025, user interface output devices 1030, user interface input devices 1035, a communications subsystem 1040, and the like.

In various embodiments, the computer system 1000 typically includes conventional computer components such as the one or more processors 1005. The file storage subsystem 1025 can include a variety of memory storage devices, such as a read only memory (ROM) 1045 and random access memory (RAM) 1050 in the memory subsystem 1020, and direct access storage devices such as disk drives.

The user interface output devices 1030 can comprise a variety of devices including flat panel displays, touchscreens, indicator lights, audio devices, force feedback devices, and the like. The user interface input devices 1035 can comprise a variety of devices including a computer mouse, trackball, trackpad, joystick, wireless remote, drawing tablet, voice command system, eye tracking system, and the like. The user interface input devices 1035 typically allow a user to select objects, icons, text and the like that appear on the user interface output devices 1030 via a command such as a click of a button or the like.

Embodiments of the communication subsystem 1040 typically include an Ethernet card, a modem (telephone, satellite, cable, ISDN), (asynchronous) digital subscriber line (DSL) unit, FireWire (IEEE 1394) interface, USB interface, and the like. For example, the communications subsystem 1040 may be coupled to communications networks and other external systems 1055 (e.g., a network such as a LAN or the Internet), to a FireWire bus, or the like. In other embodiments, the communications subsystem 1040 may be physically integrated on the motherboard of the computer system 1000, may be a software program, such as soft DSL, or the like.

The RAM 1050 and the file storage subsystem 1025 are examples of tangible media configured to store data such as RAID configuration data, codewords, and program instructions to perform the operations described herein when executed by the one or more processors, including executable computer code, human readable code, or the like. Other types of tangible media include program product media such as floppy disks, removable hard disks, optical storage media such as CDs, DVDs, and bar code media, semiconductor memories such as flash memories, read-only-memories (ROMs), battery-backed volatile memories, networked storage devices, and the like. The file storage subsystem 1025 includes reader subsystems that can transfer data from the program product media to the storage subsystem 1015 for operation and execution by the processors 1005.

The computer system 1000 may also include software that enables communications over a network (e.g., the communications network 1055) such as the DNS, TCP/IP, UDP/IP, and HTTP/HTTPS protocols, and the like. In alternative embodiments, other communications software and transfer protocols may also be used, for example IPX, or the like.

It will be readily apparent to one of ordinary skill in the art that many other hardware and software configurations are suitable for use with the present invention. For example, the computer system 1000 may be a desktop, portable, rack-mounted, or tablet configuration. Additionally, the computer system 1000 may be a series of networked computers. Further, a variety of microprocessors are contemplated and are suitable for the one or more processors 1005, such as micro- processors from Intel Corporation of Santa Clara, Calif., USA; microprocessors from Advanced Micro Devices, Inc. of Sunnyvale, Calif., USA; and the like. Further, a variety of operating systems are contemplated and are suitable, such as WINDOWS. XP, WINDOWS 7, or the like from Microsoft Corporation of Redmond, Wash., USA, SOLARIS from Sun Microsystems, Inc. of Santa Clara, Calif., USA, various Linux and UNIX distributions, and the like. In still other embodiments, the techniques described above may be implemented upon a chip or an auxiliary processing board (e.g., a programmable logic device or graphics processor unit).

The present invention can be implemented in the form of control logic in software or hardware or a combination of both. The control logic may be stored in an information storage medium as a plurality of instructions adapted to direct an information-processing device to perform a set of steps disclosed in embodiments of the present invention. Based on the disclosure and teachings provided herein, a person of ordinary skill in the art will appreciate other ways and/or methods to implement the present invention.

X. Concluding Remarks

In this paper, we described explicit constructions of the first known systematic (n,k) MDS array codes with n−k equal to some constant, such that the amount of information needed to rebuild an erased column equals to $1/(n-k)$, which matches the information-theoretic lower bound.

Also, it is interesting to consider the ratio of read accesses in the case of a write (update) operation. For example, in an array code with 2 redundancies, in order to update a single information element, one needs to read at least 3 times and write 3 times, because we need to know the values of the old information and old parity and compute the new parity element (by subtracting the old information from the parity and adding the new information). However, in our optimal code construction with 2 redundancies, if we update all the information in column 1 and the rows in the first half of the array (see FIG. 3), we do not need to read anything since we know the values of all the information needed for computing the parity. These information elements take about half the size of the entire array. So in a storage system we can cache the information to be written until most of these half elements need update (we could arrange the information in a way that these elements are often updated at the same time), and the number of reading operations compared to the information size is very small. And similarly we can do the same for any other systematic column. In general, given r redundancies, we could avoid reading operations if we update about $1/r$ of the array.

We note that one can add redundancy for the sake of lowering the rebuilding ratio. For instance, one can use three redundancies instead of two. The third parity is not used for protecting data from erasure, because in a lot of storage systems, three failures at the same time is unlikely. But with three redundancies, we are able to access only 1/3 of data instead of 1/2 and rebuild one node failure. One open problem would be to find codes with three redundancies such that the first two redundancy ensures a rebuilding ratio of 1/2 and the third redundancy further lowers the ratio. Thus, we can build a code with two redundancies first and when cost permitted, build an extra redundancy node and obtain extra gains in the ratio, which provides flexibility in practice.

Moreover, we do not know for a given array size, what the ratio is for a code defined by arbitrary permutations. In Theorem 14, we showed that $1/2+1/k$ is optimal for code constructed by binary vectors and duplication. However, the ratio is not known for arbitrary permutations. Finally, it is interesting to understand how to perform efficient rebuilding in the case of two erasures for array codes that can correct three or more erasures.

We claim:

1. A computer method of operating a controller of an array of storage nodes, the method comprising:
    receiving configuration data at the controller that indicates operating features of the array; and
    determining a parity code for operation of the array according to a permutation, wherein the configuration data specifies the array as comprising nodes defined by $A=(a_{i,j})$ with size $r^m \times k$ for some integers k,m, and wherein for $T=\{v_0, \ldots, v_{k-1}\} \subset Z_r^m$ a subset of vectors of size k, where for each $\overline{v}=(v_1, \ldots, v_m) \in T$, $gcd(v_1, \ldots, v_m, r)$, where gcd is the greatest common divisor, such that for any l, $0 \leq l \leq r-1$, and $v \in T$, the code values are determined by the permutation $f_v^l:[0,r^m-1] \to [0,r^m-1]$ by $f_v^l(x)=x+lv$.

2. The computer method of claim 1, wherein A specified by the configuration data comprises $A=(a_{i,j})$, an array of size $2^m \times k$ for some integers k, m, and $k \leq 2^m$, and wherein for $T \in F_2^m$ is a subset of vectors of size k that does not contain the zero vector, and for $v \in T$ the permutation is given by $f_v:[0, 2^m-1] \to [0,2^m-1]$ by $f_v(x)=x+v$, where x is represented in its binary representation.

3. The computer method of claim 2, wherein for the permutations $f_0, \ldots, f_m$ and for sets $X_0, \ldots, X_m$ constructed by the vectors $\{e_i\}_{i=0}^m$, the set $X_0$ is modified to be $X_0=\{x \in F_2^m: x \cdot (1,1,\ldots,1)=0\}$.

4. The computer method of claim 2, further comprising generating an s-duplication code of the code values, such that generating the s-duplication code comprises assigning $\alpha_{i,j}^{(t)}=1$ for all i, j, t, such that for odd q, and $s \leq q-1$ and assigning for all $t \in [0,s-1]$ $$\beta_{i,j}^{(t)} = \begin{cases} a^{t+1}, & \text{if } u_j \cdot i = 1 \\ a^t, & o.w. \end{cases}$$

where $u_j = \sum_{l=0}^j e_l$ and for even q (powers of 2), and $s \leq q-2$ and assigning for all $t \in [0,s-1]$ $$\beta_{i,j}^{(t)} = \begin{cases} a^{-t-1}, & \text{if } u_j \cdot i = 1 \\ a^{t+1}, & o.w.. \end{cases}$$

5. The computer method of claim 3, wherein the code comprises a (k+2, k) MDS (maximum distance separable) array code, and the array has size $2^m \times (k+2)$, wherein the permutations are defined by $f_j$, $j \in [0, k-1]$ and for systematic information elements $a_{i,j}$, and for row and zigzag parity elements $r_i$ and $z_i$, respectively, for $i \in [0,2^m-1]$, $j \in [0, k-1]$ and for row coefficients given by $\alpha_{i,j}=1$ for all i,j, and zigzag coefficients given by $\beta_{i,j}$ in some finite field F, the method further comprising:
    for a single erasure,
    (1) where one parity node is erased, rebuilding the row parity according to $$r_i = \sum_{j=0}^{k-1} a_{i,j},$$

and rebuilding the zigzag parity by $$z_i = \sum_{j=0}^{k-1} \beta_{f_j^{-1}(i),j} a_{f_j^{-1}(i),j};$$

(2) where one information node j is erased, rebuilding the elements in rows $X_j$ and those in rows $\overline{X_j}$ by zigzags; and
for two erasures,
(1) where two parity nodes are erased, rebuilding by the one parity erasure rebuilding,
(2) where one parity node and one information node is erased, and if the row parity node is erased, then rebuild by zigzags; otherwise rebuilding by rows;
(3) where two information nodes $j_1$ and $j_2$ are erased, then if $f_{j_1}=f_{j_2}$, for any $i \in [0,2^m-1]$, computing $x_i = r_i - \sum_{j \neq j_1, j_2} a_{i,j}$ $y_i = z_{f_{j_1}(i)} - \sum_{j \neq j_1, j_2} \beta_{f_j^{-1}(i),j} a_{f_j^{-1}(i),j};$ solving $a_{i,j_1}, a_{i,j_2}$ from the equations $$\begin{bmatrix} 1 & 1 \\ \beta_{i,j_1} & \beta_{i,j_2} \end{bmatrix} \begin{bmatrix} a_{i,j_1} \\ a_{i,j_2} \end{bmatrix} = \begin{bmatrix} x_i \\ y_i \end{bmatrix}$$

else, for any $i \in [0,2^m-1]$, setting $i'=i+f_{j_1}(0)+f_{j_2}(0)$, and computing $x_i, x_{i'}, y_i, y_{i'}$ according to the two information nodes operation (3) and then solving $a_{i,j_1}, a_{i,j_2}, a_{i',j_1}, a_{i',j_2}$ from equations $$\begin{bmatrix} 1 & 1 & 0 & 0 \\ 0 & 0 & 1 & 1 \\ \beta_{i,j_1} & 0 & 0 & \beta_{i',j_2} \\ 0 & \beta_{i,j_2} & \beta_{i',j_1} & 0 \end{bmatrix} \begin{bmatrix} a_{i,j_1} \\ a_{i,j_2} \\ a_{i',j_1} \\ a_{i',j_2} \end{bmatrix} = \begin{bmatrix} x_i \\ x_{i'} \\ y_i \\ y_{i'} \end{bmatrix}.$$

6. A controller of an array of storage nodes, the controller comprising:
    a host interface through which the controller communicates with a host computer;
    a node interface through which the controller communicates with the array of storage nodes;
    a processor that operates a controller application for:
        receiving configuration data at the controller that indicates operating features of the array; and
        determining a parity code for operation of the array according to a permutation, wherein the configuration data specifies the array as comprising nodes defined by $A=(a_{i,j})$ with size $r^m \times k$ for some integers k,m, and wherein for $T=\{v_0, \ldots, v_{k-1}\} \subset Z_r^m$ a subset of vectors of size k, where for each $\overline{v}=(v_1, \ldots, v_m) \in T$, $gcd(v_1, \ldots, v_m, r)$, where gcd is the greatest common divisor, such that for any l, $0 \leq l \leq r-1$, and $v \in T$, the code values are determined by the permutation $f_v^l:[0, r^m-1] \to [0,r^m-1]$ by $f_v^l(x)=x+lv$.

7. The controller of claim 6, wherein A specified by the configuration data comprises $A=(a_{i,j})$, an array of size $2^m \times k$ for some integers k, m, and k≤$2^m$, and wherein for T ⊂$F_2^m$ is a subset of vectors of size k that does not contain the zero vector, and for v ∈ T the permutation is given by $f_v$:[0,$2^m$−1]→[0,$2^m$−1]by $f_v(x)$=x+v, where x is represented in its binary representation.

8. The controller of claim 7, wherein for the permutations $f_0, \ldots, f_m$ and for sets $X_0, \ldots, X_m$ constructed by the vectors $\{e_i\}_{i=0}^m$, the set $X_0$ is modified to be $X_0$={x ∈$F_2^m$: x·(1, 1, . . . , 1)=0}.

9. The controller of claim 7, further comprising generating an s-duplication code of the code values, such that generating the s-duplication code comprises assigning $\alpha_{i,j}^{(t)}$=1 for all i, j, t, such that for odd q, and s≤q−1 and assigning for all t ∈[0,s−1]

$$\beta_{i,j}^{(t)} = \begin{cases} a^{t+1}, & \text{if } u_j \cdot i = 1 \\ a^t, & o.w \end{cases}$$

where $u_j = \sum_{l=0}^{j} e_l$, and for even q (powers of 2), and s≤q−2 and assigning for all t ∈[0,s−1]

$$\beta_{i,j}^{(t)} = \begin{cases} a^{-t-1}, & \text{if } u_j \cdot i = 1 \\ a^{t+1}, & o.w.. \end{cases}$$

10. The controller of claim 8, wherein the code comprises a (k+2, k) MDS (maximum distance separable) array code, and the array has size $2^m$×(k+2), wherein the permutations are defined by $f_j$, j ∈[0,k−1]and for systematic information elements $\alpha_{i,j}$, and for row and zigzag parity elements $r_i$ and $z_i$, respectively, for i ∈[0,$2^m$−1], j ∈[0,k−1] and for row coefficients given by $\alpha_{i,j}$, =1 for all i, j , and zigzag coefficients given by $\beta_{i,j}$ in some finite field F, the method further comprising:

for a single erasure,
(1) where one parity node is erased, rebuilding the row parity according to $$r_i = \sum_{j=0}^{k-1} a_{i,j},$$

and rebuilding the zigzag parity by $$z_i = \sum_{j=0}^{k-1} \beta_{f_j^{-1}(i),j} a_{f_j^{-1}(i),j};$$

(2) where one information node j is erased, rebuilding the elements in rows $X_j$ and those in rows $\overline{X_j}$ by zigzags; and for two erasures,
(1) where two parity nodes are erased, rebuilding by the one parity erasure rebuilding,
(2) where one parity node and one information node is erased, and if the row parity node is erased, then rebuild by zigzags; otherwise rebuilding by rows;
(3) where two information nodes $j_1$ and $1_2$ are erased, then if $f_{j_1}=f_{j_2}$, for any i ∈[0,$2^m$−1], computing $x_i = r_i - \sum_{j \neq j_1, j_2} a_{i,j}$ $y_i = z_{f_{j_1}(i)} - \sum_{j \neq j_1, j_2} \beta_{f_j^{-1}(i),j} a_{f_j^{-1}(i),j};$ solving $a_{i,j_1}, a_{i,j_2}$ from the equations $$\begin{bmatrix} 1 & 1 \\ \beta_{i,j_1} & \beta_{i,j_2} \end{bmatrix} \begin{bmatrix} a_{i,j_1} \\ a_{i,j_2} \end{bmatrix} = \begin{bmatrix} x_i \\ y_i \end{bmatrix}$$

else, for any i ∈[0,$2^m$ −1], setting i'=i+$f_{j_1}(0)+f_{j_2}(0)$, and computing $x_i$, $x_{i'}$, $y_i$, $y_{i'}$ according to the two information nodes operation (3) and then solving $a_{i,j_1}, a_{i,j_2}, a_{i',j_1}, a_{i',j_2}$ from equations $$\begin{bmatrix} 1 & 1 & 0 & 0 \\ 0 & 0 & 1 & 1 \\ \beta_{i,j_1} & 0 & 0 & \beta_{i',j_2} \\ 0 & \beta_{i,j_2} & \beta_{i',j_1} & 0 \end{bmatrix} \begin{bmatrix} a_{i,j_1} \\ a_{i,j_2} \\ a_{i',j_1} \\ a_{i',j_2} \end{bmatrix} = \begin{bmatrix} x_i \\ x_{i'} \\ y_i \\ y_{i'} \end{bmatrix}.$$

* * * * *